(12) United States Patent
Gorrell

(10) Patent No.: US 7,569,836 B2
(45) Date of Patent: Aug. 4, 2009

(54) TRANSMISSION OF DATA BETWEEN MICROCHIPS USING A PARTICLE BEAM

(75) Inventor: Jonathan Gorrell, Gainesville, FL (US)

(73) Assignee: Virgin Islands Microsystems, Inc., St. Thomas, VI (US)

(*) Notice: Subject to any disclaimer, the term of this patent is extended or adjusted under 35 U.S.C. 154(b) by 530 days.

(21) Appl. No.: 11/418,129

(22) Filed: May 5, 2006

(65) Prior Publication Data

US 2007/0257206 A1  Nov. 8, 2007

(51) Int. Cl.
   *G01N 23/00* (2006.01)
   *H04B 7/00* (2006.01)
(52) U.S. Cl. .................. 250/400; 250/397; 455/41.2
(58) Field of Classification Search ................ 455/41.1, 455/41.2, 41.3, 500, 556.1, 132, 334; 398/140; 250/296 R, 396 R, 397, 399, 400
   See application file for complete search history.

(56) References Cited

U.S. PATENT DOCUMENTS

| | | | |
|---|---|---|---|
| 1,948,384 A | 2/1934 | Lawrence | |
| 2,307,086 A | 1/1943 | Varian et al. | |
| 2,431,396 A | 11/1947 | Hansell | |
| 2,473,477 A | 6/1949 | Smith | |
| 2,634,372 A | 4/1953 | Salisbury | |
| 2,932,798 A | 4/1960 | Kerst et al. | |
| 2,944,183 A | 7/1960 | Drexler | |
| 2,966,611 A | 12/1960 | Sandstrom | |
| 3,231,779 A | 1/1966 | White | |
| 3,297,905 A | 1/1967 | Rockwell et al. | |
| 3,315,117 A | 4/1967 | Udelson | |
| 3,387,169 A | 6/1968 | Farney | |
| 3,543,147 A | 11/1970 | Kovarik | |
| 3,546,524 A | 12/1970 | Stark | |
| 3,560,694 A | 2/1971 | White | |
| 3,571,642 A | 3/1971 | Westcott | |
| 3,586,899 A | 6/1971 | Fleisher | |
| 3,761,828 A | 9/1973 | Pollard et al. | |
| 3,886,399 A | 5/1975 | Symons | |
| 3,923,568 A | 12/1975 | Bersin | |
| 3,989,347 A | 11/1976 | Eschler | |
| 4,053,845 A | 10/1977 | Gould | |
| 4,282,436 A | 8/1981 | Kapetanakos | |
| 4,450,554 A | 5/1984 | Steensma et al. | |
| 4,482,779 A | 11/1984 | Anderson | |
| 4,528,659 A | 7/1985 | Jones, Jr. | |
| 4,589,107 A | 5/1986 | Middleton et al. | |

(Continued)

FOREIGN PATENT DOCUMENTS

EP           0237559 B1     12/1991

(Continued)

OTHER PUBLICATIONS

Search Report and Written Opinion mailed Apr. 23, 2008 in PCT Appln. No. PCT/US2006/022678.

(Continued)

*Primary Examiner*—Blane J Jackson
(74) *Attorney, Agent, or Firm*—Davidson Berquist Jackson & Gowdey LLP

(57) ABSTRACT

A device includes first and second chips, each chip containing at least one electronic circuit. The second chip has one or more receivers. A deflection mechanism operationally connected to an electronic circuit of the first chip directs a charged particle beam to different ones of the receivers, based, at least in part, on a data signal provided by the electronic circuit.

26 Claims, 10 Drawing Sheets

U.S. PATENT DOCUMENTS

| | | | |
|---|---|---|---|
| 4,598,397 A | 7/1986 | Nelson et al. | |
| 4,630,262 A | 12/1986 | Callens et al. | |
| 4,652,703 A | 3/1987 | Lu et al. | |
| 4,661,783 A | 4/1987 | Gover et al. | |
| 4,704,583 A | 11/1987 | Gould | |
| 4,712,042 A | 12/1987 | Hamm | |
| 4,713,581 A | 12/1987 | Haimson | |
| 4,727,550 A | 2/1988 | Chang et al. | |
| 4,740,963 A | 4/1988 | Eckley | |
| 4,740,973 A | 4/1988 | Madey | |
| 4,746,201 A | 5/1988 | Gould | |
| 4,761,059 A | 8/1988 | Yeh et al. | |
| 4,782,485 A | 11/1988 | Gollub | |
| 4,789,945 A * | 12/1988 | Niijima | 430/30 |
| 4,806,859 A | 2/1989 | Hetrick | |
| 4,809,271 A | 2/1989 | Kondo et al. | |
| 4,813,040 A | 3/1989 | Futato | |
| 4,819,228 A | 4/1989 | Baran et al. | |
| 4,829,527 A | 5/1989 | Wortman et al. | |
| 4,838,021 A | 6/1989 | Beattie | |
| 4,841,538 A | 6/1989 | Yanabu et al. | |
| 4,864,131 A | 9/1989 | Rich et al. | |
| 4,866,704 A | 9/1989 | Bergman | |
| 4,866,732 A | 9/1989 | Carey et al. | |
| 4,873,715 A | 10/1989 | Shibata | |
| 4,887,265 A | 12/1989 | Felix | |
| 4,890,282 A | 12/1989 | Lambert et al. | |
| 4,898,022 A | 2/1990 | Yumoto et al. | |
| 4,912,705 A | 3/1990 | Paneth et al. | |
| 4,932,022 A | 6/1990 | Keeney et al. | |
| 4,981,371 A | 1/1991 | Gurak et al. | |
| 5,023,563 A | 6/1991 | Harvey et al. | |
| 5,036,513 A | 7/1991 | Greenblatt | |
| 5,065,425 A | 11/1991 | Lecomte et al. | |
| 5,113,141 A | 5/1992 | Swenson | |
| 5,121,385 A | 6/1992 | Tominaga et al. | |
| 5,127,001 A | 6/1992 | Steagall et al. | |
| 5,128,729 A | 7/1992 | Alonas et al. | |
| 5,130,985 A | 7/1992 | Kondo et al. | |
| 5,150,410 A | 9/1992 | Bertrand | |
| 5,155,726 A | 10/1992 | Spinney et al. | |
| 5,157,000 A | 10/1992 | Elkind et al. | |
| 5,163,118 A | 11/1992 | Lorenzo et al. | |
| 5,185,073 A | 2/1993 | Bindra | |
| 5,187,591 A | 2/1993 | Guy et al. | |
| 5,199,918 A | 4/1993 | Kumar | |
| 5,214,650 A | 5/1993 | Renner et al. | |
| 5,233,623 A | 8/1993 | Chang | |
| 5,235,248 A | 8/1993 | Clark et al. | |
| 5,262,656 A | 11/1993 | Blondeau et al. | |
| 5,263,043 A | 11/1993 | Walsh | |
| 5,268,693 A | 12/1993 | Walsh | |
| 5,268,788 A | 12/1993 | Fox et al. | |
| 5,282,197 A | 1/1994 | Kreitzer | |
| 5,283,819 A | 2/1994 | Glick et al. | |
| 5,293,175 A | 3/1994 | Hemmie et al. | |
| 5,302,240 A | 4/1994 | Hori et al. | |
| 5,305,312 A | 4/1994 | Fornek et al. | |
| 5,341,374 A | 8/1994 | Lewen et al. | |
| 5,354,709 A | 10/1994 | Lorenzo et al. | |
| 5,446,814 A | 8/1995 | Kuo et al. | |
| 5,504,341 A | 4/1996 | Glavish | |
| 5,578,909 A | 11/1996 | Billen | |
| 5,604,352 A | 2/1997 | Schuetz | |
| 5,608,263 A | 3/1997 | Drayton et al. | |
| 5,663,971 A | 9/1997 | Carlsten | |
| 5,666,020 A | 9/1997 | Takemura | |
| 5,668,368 A | 9/1997 | Sakai et al. | |
| 5,705,443 A | 1/1998 | Stauf et al. | |
| 5,737,458 A | 4/1998 | Wojnarowski et al. | |
| 5,744,919 A | 4/1998 | Mishin et al. | |
| 5,757,009 A | 5/1998 | Walstrom | |
| 5,767,013 A | 6/1998 | Park | |
| 5,780,970 A | 7/1998 | Singh et al. | |
| 5,790,585 A | 8/1998 | Walsh | |
| 5,811,943 A | 9/1998 | Mishin et al. | |
| 5,821,836 A | 10/1998 | Katehi et al. | |
| 5,821,902 A | 10/1998 | Keen | |
| 5,825,140 A | 10/1998 | Fujisawa | |
| 5,831,270 A | 11/1998 | Nakasuji | |
| 5,847,745 A | 12/1998 | Shimizu et al. | |
| 5,889,449 A | 3/1999 | Fiedziuszko | |
| 5,889,797 A | 3/1999 | Nguyen | |
| 5,902,489 A | 5/1999 | Yasuda et al. | |
| 5,963,857 A | 10/1999 | Greywall | |
| 6,005,347 A | 12/1999 | Lee | |
| 6,008,496 A | 12/1999 | Winefordner et al. | |
| 6,040,625 A | 3/2000 | Ip | |
| 6,060,833 A | 5/2000 | Velazco | |
| 6,080,529 A | 6/2000 | Ye et al. | |
| 6,139,760 A | 10/2000 | Shim et al. | |
| 6,180,415 B1 | 1/2001 | Schultz et al. | |
| 6,195,199 B1 | 2/2001 | Yamada | |
| 6,222,866 B1 | 4/2001 | Seko | |
| 6,278,239 B1 | 8/2001 | Caporaso et al. | |
| 6,281,769 B1 | 8/2001 | Fiedziuszko | |
| 6,297,511 B1 | 10/2001 | Syllaios et al. | |
| 6,301,041 B1 | 10/2001 | Yamada | |
| 6,316,876 B1 | 11/2001 | Tanabe | |
| 6,338,968 B1 | 1/2002 | Hefti | |
| 6,370,306 B1 | 4/2002 | Sato et al. | |
| 6,373,194 B1 | 4/2002 | Small | |
| 6,376,258 B2 | 4/2002 | Hefti | |
| 6,407,516 B1 | 6/2002 | Victor | |
| 6,441,298 B1 | 8/2002 | Thio | |
| 6,448,850 B1 | 9/2002 | Yamada | |
| 6,453,087 B2 | 9/2002 | Frish et al. | |
| 6,470,198 B1 | 10/2002 | Kintaka et al. | |
| 6,504,303 B2 | 1/2003 | Small | |
| 6,525,477 B2 | 2/2003 | Small | |
| 6,534,766 B2 | 3/2003 | Abe et al. | |
| 6,545,425 B2 | 4/2003 | Victor | |
| 6,552,320 B1 | 4/2003 | Pan | |
| 6,577,040 B2 | 6/2003 | Nguyen | |
| 6,580,075 B2 * | 6/2003 | Kametani et al. | 250/310 |
| 6,603,781 B1 | 8/2003 | Stinson et al. | |
| 6,603,915 B2 | 8/2003 | Glebov et al. | |
| 6,624,916 B1 | 9/2003 | Green et al. | |
| 6,636,185 B1 | 10/2003 | Spitzer et al. | |
| 6,636,534 B2 | 10/2003 | Madey et al. | |
| 6,636,653 B2 | 10/2003 | Miracky et al. | |
| 6,640,023 B2 | 10/2003 | Miller et al. | |
| 6,642,907 B2 | 11/2003 | Hamada et al. | |
| 6,687,034 B2 | 2/2004 | Wine et al. | |
| 6,724,486 B1 | 4/2004 | Shull et al. | |
| 6,738,176 B2 | 5/2004 | Rabinowitz et al. | |
| 6,741,781 B2 | 5/2004 | Furuyama | |
| 6,782,205 B2 | 8/2004 | Trisnadi et al. | |
| 6,791,438 B2 | 9/2004 | Takahashi et al. | |
| 6,800,877 B2 | 10/2004 | Victor et al. | |
| 6,801,002 B2 | 10/2004 | Victor et al. | |
| 6,819,432 B2 | 11/2004 | Pepper et al. | |
| 6,829,286 B1 | 12/2004 | Guilfoyle et al. | |
| 6,834,152 B2 | 12/2004 | Gunn et al. | |
| 6,870,438 B1 | 3/2005 | Shino et al. | |
| 6,871,025 B2 | 3/2005 | Maleki et al. | |
| 6,885,262 B2 | 4/2005 | Nishimura et al. | |
| 6,900,447 B2 | 5/2005 | Gerlach et al. | |
| 6,909,092 B2 | 6/2005 | Nagahama | |
| 6,909,104 B1 | 6/2005 | Koops | |
| 6,924,920 B2 | 8/2005 | Zhilkov | |
| 6,936,981 B2 | 8/2005 | Gesley | |
| 6,943,650 B2 | 9/2005 | Ramprasad et al. | |
| 6,944,369 B2 | 9/2005 | Deliwala | |

| | | | | | | |
|---|---|---|---|---|---|---|
| 6,952,492 B2 * | 10/2005 | Tanaka et al. ............... 382/149 | | 2005/0082469 A1 | 4/2005 | Carlo |
| 6,953,291 B2 | 10/2005 | Liu | | 2005/0092929 A1 | 5/2005 | Schneiker |
| 6,954,515 B2 | 10/2005 | Bjorkholm et al. | | 2005/0104684 A1 | 5/2005 | Wojcik et al. |
| 6,965,284 B2 | 11/2005 | Maekawa et al. | | 2005/0105690 A1 | 5/2005 | Pau et al. |
| 6,965,625 B2 | 11/2005 | Mross et al. | | 2005/0145882 A1 | 7/2005 | Taylor et al. |
| 6,972,439 B1 | 12/2005 | Kim et al. | | 2005/0152635 A1 | 7/2005 | Paddon et al. |
| 6,995,406 B2 | 2/2006 | Tojo et al. | | 2005/0162104 A1 | 7/2005 | Victor et al. |
| 7,010,183 B2 | 3/2006 | Estes et al. | | 2005/0190637 A1 | 9/2005 | Ichimura et al. |
| 7,064,500 B2 | 6/2006 | Victor et al. | | 2005/0194258 A1 | 9/2005 | Cohen et al. |
| 7,068,948 B2 | 6/2006 | Wei et al. | | 2005/0201707 A1 | 9/2005 | Glebov et al. |
| 7,092,588 B2 | 8/2006 | Kondo | | 2005/0201717 A1 | 9/2005 | Matsumura et al. |
| 7,092,603 B2 | 8/2006 | Glebov et al. | | 2005/0212503 A1 | 9/2005 | Deibele |
| 7,122,978 B2 | 10/2006 | Nakanishi et al. | | 2005/0231138 A1 | 10/2005 | Nakanishi et al. |
| 7,130,102 B2 | 10/2006 | Rabinowitz | | 2005/0249451 A1 | 11/2005 | Baehr-Jones et al. |
| 7,177,515 B2 | 2/2007 | Estes et al. | | 2005/0285541 A1 | 12/2005 | LeChevalier |
| 7,230,201 B1 | 6/2007 | Miley et al. | | 2006/0007730 A1 | 1/2006 | Nakamura et al. |
| 7,253,426 B2 | 8/2007 | Gorrell et al. | | 2006/0018619 A1 | 1/2006 | Helffrich et al. |
| 7,267,459 B2 | 9/2007 | Matheson | | 2006/0035173 A1 | 2/2006 | Davidson et al. |
| 7,267,461 B2 | 9/2007 | Kan et al. | | 2006/0045418 A1 | 3/2006 | Cho et al. |
| 7,309,953 B2 | 12/2007 | Tiberi et al. | | 2006/0050269 A1 | 3/2006 | Brownell |
| 7,342,441 B2 | 3/2008 | Gorrell et al. | | 2006/0060782 A1 | 3/2006 | Khursheed |
| 7,362,972 B2 | 4/2008 | Yavor et al. | | 2006/0062258 A1 | 3/2006 | Brau et al. |
| 7,375,631 B2 | 5/2008 | Moskowitz et al. | | 2006/0131695 A1 | 6/2006 | Kuekes et al. |
| 7,436,177 B2 | 10/2008 | Gorrell et al. | | 2006/0159131 A1 | 7/2006 | Liu et al. |
| 7,442,940 B2 | 10/2008 | Gorrell et al. | | 2006/0164496 A1 | 7/2006 | Tokutake et al. |
| 7,443,358 B2 | 10/2008 | Gorrell et al. | | 2006/0187794 A1 * | 8/2006 | Harvey et al. ............... 369/103 |
| 7,470,920 B2 | 12/2008 | Gorrell et al. | | 2006/0208667 A1 | 9/2006 | Lys et al. |
| 7,473,917 B2 | 1/2009 | Singh | | 2006/0216940 A1 | 9/2006 | Gorrell et al. |
| 2001/0025925 A1 | 10/2001 | Abe et al. | | 2006/0243925 A1 | 11/2006 | Barker et al. |
| 2002/0009723 A1 | 1/2002 | Hefti | | 2006/0274922 A1 | 12/2006 | Ragsdale |
| 2002/0027481 A1 | 3/2002 | Fiedziuszko | | 2007/0003781 A1 | 1/2007 | de Rochemont |
| 2002/0036121 A1 | 3/2002 | Ball et al. | | 2007/0013765 A1 | 1/2007 | Hudson et al. |
| 2002/0036264 A1 | 3/2002 | Nakasuji et al. | | 2007/0075264 A1 | 4/2007 | Gorrell et al. |
| 2002/0053638 A1 | 5/2002 | Winkler et al. | | 2007/0086915 A1 | 4/2007 | LeBoeuf et al. |
| 2002/0068018 A1 | 6/2002 | Pepper et al. | | 2007/0116420 A1 | 5/2007 | Estes et al. |
| 2002/0070671 A1 | 6/2002 | Small | | 2007/0146704 A1 | 6/2007 | Schmidt et al. |
| 2002/0071457 A1 | 6/2002 | Hogan | | 2007/0152176 A1 | 7/2007 | Gorrell et al. |
| 2002/0135665 A1 | 9/2002 | Gardner | | 2007/0154846 A1 | 7/2007 | Gorrell et al. |
| 2002/0191650 A1 | 12/2002 | Madey et al. | | 2007/0194357 A1 | 8/2007 | Oohashi |
| 2003/0010979 A1 | 1/2003 | Pardo et al. | | 2007/0200940 A1 | 8/2007 | Gruhlke et al. |
| 2003/0012925 A1 | 1/2003 | Gorrell | | 2007/0252983 A1 | 11/2007 | Tong et al. |
| 2003/0016421 A1 | 1/2003 | Small | | 2007/0258689 A1 | 11/2007 | Gorrell et al. |
| 2003/0034535 A1 | 2/2003 | Barenburu et al. | | 2007/0258690 A1 | 11/2007 | Gorrell et al. |
| 2003/0103150 A1 | 6/2003 | Catrysse et al. | | 2007/0259641 A1 | 11/2007 | Gorrell |
| 2003/0106998 A1 | 6/2003 | Colbert et al. | | 2007/0264023 A1 | 11/2007 | Gorrell et al. |
| 2003/0155521 A1 | 8/2003 | Feuerbaum | | 2007/0264030 A1 | 11/2007 | Gorrell et al. |
| 2003/0158474 A1 | 8/2003 | Scherer et al. | | 2007/0284527 A1 | 12/2007 | Zani et al. |
| 2003/0164947 A1 | 9/2003 | Vaupel | | 2008/0069509 A1 | 3/2008 | Gorrell et al. |
| 2003/0179974 A1 | 9/2003 | Estes et al. | | 2008/0302963 A1 | 12/2008 | Nakasuji et al. |
| 2003/0206708 A1 | 11/2003 | Estes et al. | | | | |
| 2003/0214695 A1 | 11/2003 | Abramson et al. | | | | |
| 2004/0061053 A1 | 4/2004 | Taniguchi et al. | | | | |
| 2004/0080285 A1 | 4/2004 | Victor et al. | | | | |
| 2004/0085159 A1 | 5/2004 | Kubena et al. | | | | |
| 2004/0092104 A1 | 5/2004 | Gunn, III et al. | | | | |
| 2004/0108471 A1 | 6/2004 | Luo et al. | | | | |
| 2004/0108473 A1 | 6/2004 | Melnychuk et al. | | | | |
| 2004/0136715 A1 | 7/2004 | Kondo | | | | |
| 2004/0150991 A1 | 8/2004 | Ouderkirk et al. | | | | |
| 2004/0171272 A1 | 9/2004 | Jin et al. | | | | |
| 2004/0180244 A1 | 9/2004 | Tour et al. | | | | |
| 2004/0184270 A1 | 9/2004 | Halter | | | | |
| 2004/0213375 A1 | 10/2004 | Bjorkholm et al. | | | | |
| 2004/0217297 A1 | 11/2004 | Moses et al. | | | | |
| 2004/0218651 A1 | 11/2004 | Iwasaki et al. | | | | |
| 2004/0231996 A1 | 11/2004 | Webb | | | | |
| 2004/0240035 A1 | 12/2004 | Zhilkov | | | | |
| 2004/0264867 A1 | 12/2004 | Kondo | | | | |
| 2005/0023145 A1 | 2/2005 | Cohen et al. | | | | |
| 2005/0045821 A1 | 3/2005 | Noji et al. | | | | |
| 2005/0045832 A1 | 3/2005 | Kelly et al. | | | | |
| 2005/0054151 A1 | 3/2005 | Lowther et al. | | | | |
| 2005/0067286 A1 | 3/2005 | Ahn et al. | | | | |

FOREIGN PATENT DOCUMENTS

| | | |
|---|---|---|
| JP | 2004-32323 A | 1/2004 |
| WO | WO 87/01873 | 3/1987 |
| WO | WO 93/21663 A1 | 10/1993 |
| WO | WO 00/72413 | 11/2000 |
| WO | WO 02/025785 | 3/2002 |
| WO | WO 02/077607 | 10/2002 |
| WO | WO 2004/086560 | 10/2004 |
| WO | WO 2005/015143 A2 | 2/2005 |
| WO | WO 2005/098966 | 10/2005 |
| WO | WO 2006/042239 A2 | 4/2006 |
| WO | WO 2007/081389 | 7/2007 |
| WO | WO 2007/081390 | 7/2007 |
| WO | WO 2007/081391 | 7/2007 |

OTHER PUBLICATIONS

Search Report and Written Opinion mailed Apr. 3, 2008 in PCT Appln. No. PCT/US2006/027429.

Search Report and Written Opinion mailed Jun. 18, 2008 in PCT Appln. No. PCT/US2006/027430.

Search Report and Written Opinion mailed Jun. 3, 2008 in PCT Appln. No. PCT/US2006/022783.

Search Report and Written Opinion mailed Mar. 24, 2008 in PCT Appln. No. PCT/US2006/022677.
Search Report and Written Opinion mailed Mar. 24, 2008 in PCT Appln. No. PCT/US2006/022784.
Search Report and Written Opinion mailed May 2, 2008 in PCT Appln. No. PCT/US2006/023280.
Search Report and Written Opinion mailed May 21, 2008 in PCT Appln. No. PCT/US2006/023279.
Search Report and Written Opinion mailed May 22, 2008 in PCT Appln. No. PCT/US2006/022685.
International Search Report and Written Opinion mailed Nov. 23, 2007 in International Application No. PCT/US2006/022786.
Search Report and Written Opinion mailed Oct. 25, 2007 in PCT Appln. No. PCT/US2006/022687.
Search Report and Written Opinion mailed Oct. 26, 2007 in PCT Appln. No. PCT/US2006/022675.
Search Report and Written Opinion mailed Sep. 21, 2007 in PCT Appln. No. PCT/US2006/022688.
Search Report and Written Opinion mailed Sep. 25, 2007 in PCT Appln. No. PCT/US2006/022681.
Search Report and Written Opinion mailed Sep. 26, 2007 in PCT Appln. No. PCT/US2006/024218.
U.S. Appl. No. 11/418,082, filed May 5, 2006, Gorrell et al.
J. C. Palais, "Fiber optic communications," Prentice Hall, New Jersey, 1998, pp. 156-158.
Search Report and Written Opinion mailed Dec. 20, 2007 in PCT Appln. No. PCT/US2006/022771.
Search Report and Written Opinion mailed Jan. 31, 2008 in PCT Appln. No. PCT/US2006/027427.
Search Report and Written Opinion mailed Jan. 8, 2008 in PCT Appln. No. PCT/US2006/028741.
Search Report and Written Opinion mailed Mar. 11, 2008 in PCT Appln. No. PCT/US2006/022679.
Search Report and Written Opinion mailed Aug. 24, 2007 in PCT Appln. No. PCT/US2006/022768.
Search Report and Written Opinion mailed Aug. 31, 2007 in PCT Appln. No. PCT/US2006/022680.
Search Report and Written Opinion mailed Jul. 16, 2007 in PCT Appln. No. PCT/US2006/022774.
Search Report and Written Opinion mailed Jul. 20, 2007 in PCT Appln. No. PCT/US2006/024216.
Search Report and Written Opinion mailed Jul. 26, 2007 in PCT Appln. No. PCT/US2006/022776.
Search Report and Written Opinion mailed Jun. 20, 2007 in PCT Appln. No. PCT/US2006/022779.
Search Report and Written Opinion mailed Sep. 12, 2007 in PCT Appln. No. PCT/US2006/022767.
Search Report and Written Opinion mailed Sep. 13, 2007 in PCT Appln. No. PCT/US2006/024217.
Search Report and Written Opinion mailed Sep. 17, 2007 in PCT Appln. No. PCT/US2006/022787.
Search Report and Written Opinion mailed Sep. 5, 2007 in PCT Appln. No. PCT/US2006/027428.
Search Report and Written Opinion mailed Sep. 17, 2007 in PCT Appln. No. PCT/US2006/022689.
Lee Kwang-Cheol et al., "Deep X-Ray Mask with Integrated Actuator for 3D Microfabrication", Conference: Pacific Rim Workshop on Transducers and Micro/Nano Technologies, (Xiamen CHN), Jul. 22, 2002.
Markoff, John, "A Chip That Can Transfer Data Using Laser Light," The New York Times, Sep. 18, 2006.
S.M. Sze, "Semiconductor Devices Physics and Technology", 2nd Edition, Chapters 9 and 12, Copyright 1985, 2002.
Search Report and Written Opinion mailed Feb. 12, 2007 in PCT Appln. No. PCT/US2006/022682.
Search Report and Written Opinion mailed Feb. 20, 2007 in PCT Appln. No. PCT/US2006/022676.
Search Report and Written Opinion mailed Feb. 20, 2007 in PCT Appln. No. PCT/US2006/022772.
Search Report and Written Opinion mailed Feb. 20, 2007 in PCT Appln. No. PCT/US2006/022780.
Search Report and Written Opinion mailed Feb. 21, 2007 in PCT Appln. No. PCT/US2006/022684.

Search Report and Written Opinion mailed Jan. 17, 2007 in PCT Appln. No. PCT/US2006/022777.
Search Report and Written Opinion mailed Jan. 23, 2007 in PCT Appln. No. PCT/US2006/022781.
Search Report and Written Opinion mailed Mar. 7, 2007 in PCT Appln. No. PCT/US2006/022775.
Speller et al., "A Low-Noise MEMS Accelerometer for Unattended Ground Sensor Applications", Applied MEMS Inc., 12200 Parc Crest, Stafford, TX, USA 77477, copyright 2004.
Thurn-Albrecht et al., "Ultrahigh-Density Nanowire Arrays Grown in Self-Assembled Diblock Copolymer Templates", Science 290. 5499, Dec. 15, 2000, pp. 2126-2129.
"Array of Nanoklystrons for Frequency Agility or Redundancy," NASA's Jet Propulsion Laboratory, NASA Tech Briefs, NPO-21003. 2001.
"Hardware Development Programs," Calabazas Creek Research, Inc. found at http://calcreek.com/hardware.html.
"Antenna Arrays." May 18, 2002. www.tpub.com/content/neets/14183/css/14183_159.htm.
"Diffraction Grating," hyperphysics.phy-astr.gsu.edu/hbase/phyopt/grating.html.
Alford, T.L. et al., "Advanced silver-based metallization patterning for ULSI applications," Microelectronic Engineering 55, 2001, pp. 383-388, Elsevier Science B.V.
Amato, Ivan, "An Everyman's Free-Electron Laser?" Science, New Series, Oct. 16, 1992, p. 401, vol. 258 No. 5081, American Association for the Advancement of Science.
Andrews, H.L. et al., "Dispersion and Attenuation in a Smith-Purcell Free Electron Laser," The American Physical Society, Physical Review Special Topics—Accelerators and Beams 8 (2005), pp. 050703-1 - 050703-9.
Backe, H. et al. "Investigation of Far-Infrared Smith-Purcell Radiation at the 3.41 MeV Electron Injector Linac of the Mainz Microtron MAMI," Institut fur Kernphysik, Universitat Mainz, D-55099, Mainz Germany.
Bakhtyari, A. et al., "Horn Resonator Boosts Miniature Free-Election Laser Power," Applied Physics Letters, May 12, 2003, pp. 3150-3152, vol. 82, No. 19, American Institute of Physics.
Bakhtyari, Dr. Arash, "Gain Mechanism in a Smith-Purcell MicroFEL," Abstract, Department of Physics and Astronomy, Dartmouth College.
Bhattacharjee, Sudeep et al., "Folded Waveguide Traveling-Wave Tube Sources for Terahertz Radiation." IEEE Transactions on Plasma Science, vol. 32, No. 3, Jun. 2004, pp. 1002-1014.
Booske, J.H. et al., "Microfabricated TWTs as High Power, Wideband Sources of THz Radiation".
Brau, C.A. et al., "Gain and Coherent Radiation from a Smith-Purcell Free Electron Laser," Proceedings of the 2004 FEL Conference, pp. 278-281.
Brownell, J.H. et al., "Improved µFEL Performance with Novel Resonator," Jan. 7, 2005, from website: www.frascati.enea.it/thz-bridge/workshop/presentations/Wednesday/We-07-Brownell.ppt.
Brownell, J.H. et al., "The Angular Distribution of the Power Produced by Smith-Purcell Radiation," J. Phys. D: Appl. Phys. 1997, pp. 2478-2481, vol. 30, IOP Publishing Ltd., United Kingdom.
Chuang, S.L. et al., "Enhancement of Smith-Purcell Radiation from a Grating with Surface-Plasmon Excitation," Journal of the Optical Society of America, Jun. 1984, pp. 672-676, vol. 1 No. 6, Optical Society of America.
Chuang, S.L. et al., "Smith-Purcell Radiation from a Charge Moving Above a Penetrable Grating," IEEE MTT-S Digest, 1983, pp. 405-406, IEEE.
Far-IR, Sub-MM & MM Detector Technology Workshop list of manuscripts, session 6 2002.
Feltz, W.F. et al., "Near-Continuous Profiling of Temperature, Moisture, and Atmospheric Stability Using the Atmospheric Emitted Radiance Interferometer (AERI)," Journal of Applied Meteorology, May 2003, vol. 42 No. 5, H.W. Wilson Company, pp.584-597.
Freund, H.P. et al., "Linearized Field Theory of a Smith-Purcell Traveling Wave Tube," IEEE Transactions on Plasma Science, Jun. 2004, pp. 1015-1027, vol. 32 No. 3, IEEE.
Gallerano, G.P. et al., "Overview of Terahertz Radiation Sources," Proceedings of the 2004 FEL Conference, pp. 216-221.

Goldstein, M. et al., "Demonstration of a Micro Far-Infrared Smith-Purcell Emitter," Applied Physics Letters, Jul. 28, 1997, pp. 452-454, vol. 71 No. 4, American Institute of Physics.

Gover, A. et al., "Angular Radiation Pattern of Smith-Purcell Radiation," Journal of the Optical Society of America, Oct. 1984, pp. 723-728, vol. 1 No. 5, Optical Society of America.

Grishin, Yu. A. et al., "Pulsed Orotron - A New Microwave Source for Submillimeter Pulse High -Field Electron Paramagnetic Resonance Spectroscopy," Review of Scientific Instruments, Sep. 2004, pp. 2926-2936, vol. 75, No. 9, American Institute of Physics.

Ishizuka, H. et al., "Smith-Purcell Experiment Utilizing a Field-Emitter Array Cathode: Measurements of Radiation," Nuclear Instruments and Methods in Physics Research, 2001, pp. 593-598, A 475, Elsevier Science B.V.

Ishizuka, H. et al., "Smith-Purcell Radiation Experiment Using a Field-Emission Array Cathode," Nuclear Instruments and Methods in Physics Research, 2000, pp. 276-280, A 445, Elsevier Science B.V.

Ives, Lawrence et al., "Development of Backward Wave Oscillators for Terahertz Applications," Terahertz for Military and Security Applications, Proceedings of SPIE vol. 5070 (2003), pp. 71-82.

Ives, R. Lawrence, "IVEC Summary, Session 2, Sources I" 2002.

Jonietz, Erika, "Nano Antenna Gold nanospheres show path to all-optical computing," Technology Review, Dec. 2005/Jan. 2006, p. 32.

Joo, Youngcheol et al., "Air Cooling of IC Chip with Novel Microchannels Monolithically Formed on Chip Front Surface," Cooling and Thermal Design of Electronic Systems (HTD-vol. 319 & EEP-vol. 15), International Mechanical Engineering Congress and Exposition, San Francisco, CA Nov. 1995 pp. 117-121.

Joo, Youngcheol et al., "Fabrication of Monolithic Microchannels for IC Chip Cooling," 1995, Mechanical, Aerospace and Nuclear Engineering Department, University of California at Los Angeles.

Jung, K.B. et al., "Patterning of Cu, Co, Fe, and Ag for magnetic nanostructures," J. Vac. Sci. Technol. A 15(3), May/Jun. 1997, pp. 1780-1784.

Kapp, Oscar H. et al., "Modification of a Scanning Electron Microscope to Produce Smith-Purcell Radiation," Review of Scientific Instruments, Nov. 2004, pp. 4732-4741, vol. 75 No. 11, American Institute of Physics.

Kiener, C. et al., "Investigation of the Mean Free Path of Hot Electrons in GaAs/AlGaAs Heterostructures," Semicond. Sci. Technol., 1994, pp. 193-197, vol. 9, IOP Publishing Ltd., United Kingdom.

Kim, Shang Hoon, "Quantum Mechanical Theory of Free-Electron Two-Quantum Stark Emission Driven by Transverse Motion," Journal of the Physical Society of Japan, Aug. 1993, vol. 62, No. 8, pp. 2528-2532.

Korbly, S.E. et al., "Progress on a Smith-Purcell Radiation Bunch Length Diagnostic," Plasma Science and Fusion Center, MIT, Cambridge, MA.

Kormann, T. et al., "A Photoelectron Source for the Study of Smith-Purcell Radiation".

Kube, G. et al., "Observation of Optical Smith-Purcell Radiation at an Electron Beam Energy of 855 MeV," Physical Review E, May 8, 2002, vol. 65, The American Physical Society, pp. 056501-1 - 056501-15.

Liu, Chuan Sheng, et al., "Stimulated Coherent Smith-Purcell Radiation from a Metallic Grating," IEEE Journal of Quantum Electronics, Oct. 1999, pp 1386-1389, vol. 35, No. 10, IEEE.

Manohara, Harish et al., "Field Emission Testing of Carbon Nanotubes for THz Frequency Vacuum Microtube Sources." Abstract. Dec. 2003. from SPIEWeb.

Manohara, Harish M. et al., "Design and Fabrication of a THz Nanoklystron".

Manohara, Harish M. et al., "Design and Fabrication of a THz Nanoklystron" (www.sofia.usra.edu/det_workshop/ posters/session 3/3-43manohara_poster.pdf), PowerPoint Presentation.

McDaniel, James C. et al., "Smith-Purcell Radiation in the High Conductivity and Plasma Frequency Limits," Applied Optics, Nov. 15, 1989, pp. 4924-4929, vol. 28 No. 22, Optical Society of America.

Meyer, Stephan, "Far IR, Sub-MM & MM Detector Technology Workshop Summary," Oct. 2002. (may date the Manohara documents).

Mokhoff, Nicolas, "Optical-speed light detector promises fast space talk," EETimes Online, Mar. 20, 2006, from website: www.eetimes.com/showArticle.jhtm?articleID=183701047.

Nguyen, Phucanh et al., "Novel technique to pattern silver using CF4 and CF4/O2 glow discharges," J. Vac. Sci, Technol. B. 19 (1), Jan./Feb. 2001, American Vacuum Society, pp. 158-165.

Nguyen, Phucanh et al., "Reactive ion etch of patterned and blanket silver thin films in Cl2/O2 and O2 glow discharges," J. Vac. Sci, Technol. B. 17 (5), Sep./Oct. 1999, American Vacuum Society, pp. 2204-2209.

Ohtaka, Kazuo, "Smith-Purcell Radiation from Metallic and Dielectric Photonic Crystals," Center for Frontier Science, pp. 272-273, Chiba University, 1-33 Yayoi, Inage-ku, Chiba-shi, Japan.

Phototonics Research, "Surface-Plasmon-Enhanced Random Laser Demonstrated," Phototonics Spectra, Feb. 2005, pp. 112-113.

Platt, C.L. et al., "A New Resonator Design for Smith-Purcell Free Electron Lasers," 6Q19, p. 296.

Potylitsin, A.P., "Resonant Diffraction Radiation and Smith-Purcell Effect," (Abstract), arXiv: physics/9803043 v2 Apr. 13, 1998.

Potylitsyn, A.P., "Resonant Diffraction Radiation and Smith-Purcell Effect," Physics Letters A, Feb. 2, 1998, pp. 112-116, A 238, Elsevier Science B.V.

S. Hoogland et al., "A solution-processed 1.53 µm quantum dot laser with temperature -invariant emission wavelength," Optics Express, vol.14, No. 8, Apr. 17, 2006, pp. 3273-3281.

Savilov, Andrey V., "Stimulated Wave Scattering in the Smith-Purcell FEL," IEEE Transactions on Plasma Science, Oct. 2001, pp. 820-823, vol. 29 No. 5, IEEE.

Schachter, Levi et al., "Smith-Purcell Oscillator in an Exponential Gain Regime," Journal of Applied Physics, Apr. 15, 1989, pp. 3267-3269, vol. 65 No. 8, American Institute of Physics.

Schachter, Levi et al., "Influence of the Guiding Magnetic Field on the Performance of a Smith-Purcell Amplifier Operating in the Weak Compton Regime," Journal of the Optical Society of America, May 1990, pp. 873-876, vol. 7 No. 5, Optical Society of America.

Schachter, Levi et al., "The Influence of the Guided Magnetic Field on the Performance of a Smith-Purcell Amplifier Operating in the Strong Compton Regime," Journal of Applied Physics, Apr. 15, 1990, pp. 3582-3592, vol. 67 No. 8, American Institute of Physics.

Shih, I et al., "Experimental Investigations of Smith-Purcell Radiation," Journal of the Optical Society of America, Mar. 1990, pp. 351-356, vol. 7, No. 3, Optical Society of America.

Shih, I. et al., "Measurements of Smith-Purcell Radiation," Journal of the Optical Society of America, Mar. 1990, pp. 345-350, vol. 7 No. 3, Optical Society of America.

Swartz, J.C. et al., "THz-FIR Grating Coupled Radiation Source," Plasma Science, 1998. 1D02, p. 126.

Temkin, Richard, "Scanning with Ease Through the Far Infrared," Science, New Series, May 8, 1998, p. 854, vol. 280, No. 5365, American Association for the Advancement of Science.

Walsh, J.E., et al., 1999. From website: http://www.ieee.org/organizations/pubs/newsletters/leos/feb99/hot2.htm.

Wentworth, Stuart M. et al., "Far-Infrared Composite Microbolometers," IEEE MTT-S Digest, 1990, pp. 1309-1310.

Yamamoto, N. et al., "Photon Emission From Silver Particles Induced by a High-Energy Electron Beam," Physical Review B, Nov. 6, 2001, pp. 205419-1—205419-9, vol. 64, The American Physical Society.

Yokoo, K. et al., "Smith-Purcell Radiation at Optical Wavelength Using a Field-Emitter Array," Technical Digest of IVMC, 2003, pp. 77-78.

Zeng, Yuxiao et al., "Processing and encapsulation of silver patterns by using reactive ion etch and ammonia anneal," Materials Chemistry and Physics 66, 2000, pp. 77-82.

"An Early History - Invention of the Klystron," http://varianinc.com/cgi-bin/advprint/print.cgi?cid=KLQNPPJJFJ, printed on Dec. 26, 2008.

"An Early History - The Founding of Varian Associates," http://varianinc.com/cgi-bin/advprint/print.cgi?cid=KLQNPPJJFJ, printed on Dec. 26, 2008.

"Chapter 3 X-Ray Tube," http://compepid.tuskegee.edu/syllabi/clinical/small/radiology/chapter..., printed from tuskegee.edu on Dec. 29, 2008.

"Diagnostic imaging modalities - Ionizing vs non-ionizing radiation," http://info.med.yale.edu/intmed/cardio/imaging/techniques/ionizing_v..., printed from Yale University School of Medicine on Dec. 29, 2008.
"Frequently Asked Questions," Luxtera Inc., found at http://www.luxtera.com/technology_faq.htm, printed on Dec. 2, 2005, 4 pages.
"Klystron Amplifier," http://www.radarttutorial.eu/08.transmitters/tx12.en.html, printed on Dec. 26, 2008.
"Klystron is a Microwave Generator," http://www2.slac.stanford.edu/vvc/accelerators/klystron.html, printed on Dec. 26, 2008.
"Klystron," http:en.wikipedia.org/wiki/Klystron, printed on Dec. 26, 2008.
"Making X-rays," http://www.fnrfscience.cmu.ac.th/theory/radiation/xray-basics.html, printed on Dec. 29, 2008.
"Microwave Tubes," http://www.tpub.com/neets/book11/45b.htm, printed on Dec. 26, 2008.
"Notice of Allowability" mailed on Jan. 17, 2008 in U.S. Appl. No. 11/418,082 filed May 5, 2006.
"Technology Overview," Luxtera, Inc., found at http://www.luxtera.com/technology.htm, printed on Dec. 2, 2005, 1 page.
"The Reflex Klystron," http://www.fnrfscience.cmu.ac.th/theory/microwave%2, printed from Fast Netoron Research Facilty on Dec. 26, 2008.
"x-ray tube," http://www.answers.com/topic/x-ray-tube, printed on Dec. 29, 2008.
Mar. 24, 2006 PTO Office Action in U.S. Appl. No. 10/917,511.
Mar. 25, 2008 PTO Office Action in U.S. Appl. No. 11/411,131.
Apr. 8, 2008 PTO Office Action in U.S. Appl. No. 11/325,571.
Apr. 17, 2008 Response to PTO Office Action of Dec. 20, 2007 in U.S. Appl. No. 11/418,087.
Apr. 19, 2007 Response to PTO Office Action of Jan. 17, 2007 in U.S. Appl No. 11/418,082.
May 10, 2005 PTO Office Action in U.S. Appl. No. 10/917,511.
May 21, 2007 PTO Office Action in U.S. Appl. No. 11/418,087.
May 26, 2006 Response to PTO Office Action of Mar. 24, 2006 in U.S. Appl. No. 10/917,511.
Jun. 16, 2008 Response to PTO Office Action of Dec. 14, 2007 in U.S. Appl. No. 11/418,264.
Jun. 20, 2008 Response to PTO Office Action of Mar. 25, 2008 in U.S. Appl. No. 11/411,131.
Aug. 14, 2006 PTO Office Action in U.S. Appl. No. 10/917,511.
Sep. 1, 2006 Response to PTO Office Action of Aug. 14, 2006 in U.S. Appl. No. 10/917,511.
Sep. 12, 2005 Response to PTO Office Action of May 10, 2005 in U.S. Appl. No. 10/917,511.
Sep. 14, 2007 PTO Office Action in U.S. Appl. No. 11/411,131.
Oct. 19, 2007 Response to PTO Office Action of May 21, 2007 in U.S. Appl. No. 11/418,087.
Dec. 4, 2006 PTO Office Action in U.S. Appl. No. 11/418,087.
Dec. 14, 2007 PTO Office Action in U.S. Appl. No. 11/418,264.
Dec. 14, 2007 Response to PTO Office Action of Sep. 14, 2007 in U.S. Appl. No. 11/411,131.
Dec. 20, 2007 PTO Office Action in U.S. Appl. No. 11/418,087.
Corcoran, Elizabeth, "Ride the Light," Forbes Magazine, Apr. 11, 2005, pp. 68-70.
European Search Report mailed Mar. 3, 2009 in European Application No. 06852028.7.
Neo et al., "Smith-Purcell Radiation from Ultraviolet to Infrared Using a Si-field Emitter" Vacuum Electronics Conference, 2007, IVEC '07, IEEE International May 2007.
Sarah, Girish P. et al., "Design of a Single-Stage Depressed Collector for High-Power, Pulsed Gyroklystrom Amplifiers," IEEE Transactions on Electron Devices, vol. 45, No. 4, Apr. 1998, pp. 986-990.
Sartori, Gabriele, "CMOS Photonics Platform," Luxtera, Inc., Nov. 2005, 19 pages.
Search Report and Written Opinion mailed Jul. 14, 2008 in PCT Appln. No. PCT/US2006/022773.
Search Report and Written Opinion mailed Aug. 19, 2008 in PCT Appln. No. PCT/US2007/008363.
Search Report and Written Opinion mailed Jul. 16, 2008 in PCT Appln. No. PCT/US2006/022766.
Search Report and Written Opinion mailed Jul. 28, 2008 in PCT Appln. No. PCT/US2006/022782.
Search Report and Written Opinion mailed Jul. 3, 2008 in PCT Appln. No. PCT/US2006/022690.
Search Report and Written Opinion mailed Jul. 3, 2008 in PCT Appln. No. PCT/US2006/022778.
Search Report and Written Opinion mailed Jul. 7, 2008 in PCT Appln. No. PCT/US2006/022686.
Search Report and Written Opinion mailed Jul. 7, 2008 in PCT Appln. No. PCT/US2006/022785.
Search Report and Written Opinion mailed Sep. 2, 2008 in PCT Appln. No. PCT/US2006/022769.
Search Report and Written Opinion mailed Sep. 26, 2008 in PCT Appln. No. PCT/US2007/00053.
Search Report and Written Opinion mailed Sep. 3, 2008 in PCT Appln. No. PCT/US2006/022770.
U.S. Appl. No. 11/203,407 - Nov. 13, 2008 PTO Office Action.
U.S. Appl. No. 11/238,991 - Dec. 6, 2006 PTO Office Action.
U.S. Appl. No. 11/238,991 - Jun. 6, 2007 Response to PTO Office Action of Dec. 6, 2006.
U.S. Appl. No. 11/238,991 - Sep. 10, 2007 PTO Office Action.
U.S. Appl. No. 11/238,991 - Mar. 6, 2008 Response to PTO Office Action of Sep. 10, 2007.
U.S. Appl. No. 11/238,991 - Jun. 27, 2008 PTO Office Action.
U.S. Appl. No. 11/238,991 - Dec. 29, 2008 Response to PTO Office Action of Jun. 27, 2008.
U.S. Appl. No. 11/238,991 - Mar. 24, 2008 PTO Office Action.
U.S. Appl. No. 11/243,477 - Apr. 25, 2008 PTO Office Action.
U.S. Appl. No. 11/243,477 - Oct. 24, 2008 Response to PTO Office Action of Apr. 25, 2008.
U.S. Appl. No. 11/243,477 - Jan. 7, 2009 PTO Office Action.
U.S. Appl. No. 11/325,448 - Jun. 16, 2008 PTO Office Action.
U.S. Appl. No. 11/325,448 - Dec. 16, 2008 Response to PTO Office Action of Jun. 16, 2008.
U.S. Appl. No. 11/325,534 - Jun. 11, 2008 PTO Office Action.
U.S. Appl. No. 11/325,534 - Oct. 15, 2008 Response to PTO Office Action of Jun. 11, 2008.
U.S. Appl. No. 11/353,208 - Jan. 15, 2008 PTO Office Action.
U.S. Appl. No. 11/353,208 - Mar. 17, 2008 PTO Office Action.
U.S. Appl. No. 11/353,208 - Sep. 15, 2008 Response to PTO Office Action of Mar. 17, 2008.
U.S. Appl. No. 11/353,208 - Dec. 24, 2008 PTO Office Action.
U.S. Appl. No. 11/353,208 - Dec. 30, 2008 Response to PTO Office Action of Dec. 24, 2008.
U.S. Appl. No. 11/400,280 - Oct. 16, 2008 PTO Office Action.
U.S. Appl. No. 11/400,280 - Oct. 24, 2008 Response to PTO Office Action of Oct. 16, 2008.
U.S. Appl. No. 11/410,905 - Sep. 26, 2008 PTO Office Action.
U.S. Appl. No. 11/410,905 - Mar. 26, 2009 Response to PTO Office Action of Sep. 26, 2008.
U.S. Appl. No. 11/410,924 - Mar. 6, 2009 PTO Office Action.
U.S. Appl. No. 11/411,120 - Mar. 19, 2009 PTO Office Action.
U.S. Appl. No. 11/411,1209 - Jan. 16, 2009 Office Action.
U.S. Appl. No. 11/411,130 - May 1, 2008 PTO Office Action.
U.S. Appl. No. 11/411,130 - Oct. 29, 2008 Response to PTO Office Action of May 1, 2008.
U.S. Appl. No. 11/417,129 - Jul. 11, 2007 PTO Office Action.
U.S. Appl. No. 11/417,129 - Dec. 17, 2007 Response to PTO Office Action of Jul. 11, 2007.
U.S. Appl. No. 11/417,129 - Dec. 20, 2007 Response to PTO Office Action of Jul. 11, 2007.
U.S. Appl. No. 11/417,129 - Apr. 17, 2008 PTO Office Action.
U.S. Appl. No. 11/417,129 - Jun. 19, 2008 Response to PTO Office Action Apr. 17, 2008.
U.S. Appl. No. 11/418,079 - Apr. 11, 2008 PTO Office Action.
U.S. Appl. No. 11/418,079 - Oct. 7, 2008 Response to PTO Office Action of Apr. 11, 2008.
U.S. Appl. No. 11/418,079 - Feb. 12, 2009 PTO Office Action.
U.S. Appl. No. 11/418,080 - Mar. 18, 2009 PTO Office Action.
U.S. Appl. No. 11/418,082 - Jan. 17, 2007 PTO Office Action.
U.S. Appl. No. 11/418,083 - Jun. 20, 2008 PTO Office Action.
U.S. Appl. No. 11/418,083 - Dec. 19, 2008 Response to PTO Office Action of Jun. 20, 2008.
U.S. Appl. No. 11/418,084 - Nov. 5, 2007 PTO Office Action.

U.S. Appl. No. 11/418,084 - May 5, 2008 Response to PTO Office Action Nov. 5, 2007.
U.S. Appl. No. 11/418,084 - Aug. 19, 2008 PTO Office Action.
U.S. Appl. No. 11/418,084 - Feb. 19, 2009 Response to PTO Office Action of Aug. 19, 2008.
U.S. Appl. No. 11/418,085 - Aug. 10, 2007 PTO Office Action.
U.S. Appl. No. 11/418,085 - Nov. 13, 2007 Response to PTO Office Action of Aug. 10, 2007.
U.S. Appl. No. 11/418,085 - Feb. 12, 2008 PTO Office Action.
U.S. Appl. No. 11/418,085 - Aug. 12, 2008 Response to PTO Office Action of Feb. 12, 2008.
U.S. Appl. No. 11/418,085 - Sep. 16, 2008 PTO Office Action.
U.S. Appl. No. 11/418,085 - Mar. 6, 2009 Response to PTO Office Action of Sep. 16, 2008.
U.S. Appl. No. 11/418,087 - Dec. 29, 2006 Response to PTO Office Action of Dec. 4, 2006.
U.S. Appl. No. 11/418,087 - Feb. 15, 2007 PTO Office Action.
U.S. Appl. No. 11/418,087 - Mar. 6, 2007 Response to PTO Office Action of Feb. 15, 2007.
U.S. Appl. No. 11/418,088 - Jun. 9, 2009 PTO Office Action.
U.S. Appl. No. 11/418,088 - Dec. 12, 2008 Response to PTO Office Action of Jun. 9, 2008.
U.S. Appl. No. 11/418,089 - Mar. 21, 2008 PTO Office Action.
U.S. Appl. No. 11/418,089 - Jun. 23, 2008 Response to PTO Office Action of Mar. 21, 2008.
U.S. Appl. No. 11/418,089 - Sep. 30, 2008 PTO Office Action.
U.S. Appl. No. 11/418,089 - Mar. 30, 2009 Response to PTO Office Action of Sep. 30, 2008.
U.S. Appl. No. 11/418,091 - Jul. 30, 2007 PTO Office Action.
U.S. Appl. No. 11/418,091 - Nov. 27, 2007 Response to PTO Office Action of Jul. 30, 2007.
U.S. Appl. No. 11/418,091 - Feb. 26, 2008 PTO Office Action.
U.S. Appl. No. 11/418,097 - Jun. 2, 2008 PTO Office Action.
U.S. Appl. No. 11/418,097 - Dec. 2, 2008 Response to PTO Office Action of Jun. 2, 2008.
U.S. Appl. No. 11/418,097 - Feb. 18, 2009 PTO Office Action.
U.S. Appl. No. 11/418,099 - Jun. 23, 2008 PTO Office Action.
U.S. Appl. No. 11/418,099 - Dec. 23, 2008 Response to PTO Office Action of Jun. 23, 2008.
U.S. Appl. No. 11/418,100 - Jan. 12, 2009 PTO Office Action.
U.S. Appl. No. 11/418,123 - Apr. 25, 2008 PTO Office Action.
U.S. Appl. No. 11/418,123 - Oct. 27, 2008 Response to PTO Office Action of Apr. 25, 2008.
U.S. Appl. No. 11/418,123 - Jan. 26, 2009 PTO Office Action.
U.S. Appl. No. 11/418,124 - Oct. 1, 2008 PTO Office Action.
U.S. Appl. No. 11/418,124 - Feb. 2, 2009 Response to PTO Office Action of Oct. 1, 2008.
U.S. Appl. No. 11/419.124 - Mar. 13, 2009 PTO Office Action.
U.S. Appl. No. 11/418,126 - Oct. 12, 2006 PTO Office Action.
U.S. Appl. No. 11/418,126 - Feb. 12, 2007 Response to PTO Office Action of Oct. 12, 2006 (Redacted).
U.S. Appl. No. 11/418,126 - Jun. 6, 2007 PTO Office Action.
U.S. Appl. No. 11/418,126 - Aug. 6, 2007 Response to PTO Office Action of Jun. 6, 2007.
U.S. Appl. No. 11/418,126 - Nov. 2, 2007 PTO Office Action.
U.S. Appl. No. 11/418,126 - Feb. 22, 2008 Response to PTO Office Action of Nov. 2, 2007.
U.S. Appl. No. 11/418,126 - Jun. 10, 2008 PTO Office Action.
U.S. Appl. No. 11/418,127 - Apr. 2, 2009 Office Action.
U.S. Appl. No. 11/418,128 - Dec. 16, 2008 PTO Office Action.
U.S. Appl. No. 11/418,128 - Dec. 31, 2008 Response to PTO Office Action of Dec. 16, 2008.
U.S. Appl. No. 11/418,128 - Feb. 17, 2009 PTO Office Action, Apr. 28, 2009.
U.S. Appl. No. 11/418,244 - Jul. 1, 2008 PTO Office Action.
U.S. Appl. No. 11/418,244 - Nov. 25, 2008 Response to PTO Office Action of Jul. 1, 2008.
U.S. Appl. No. 11/418,263 - Sep. 24, 2008 PTO Office Action.
U.S. Appl. No. 11/418,263 - Dec. 24, 2008 Response to PTO Office Action of Sep. 24, 2008.
U.S. Appl. No. 11/418,263 - Mar. 9, 2009 PTO Office Action.
U.S. Appl. No. 11/418,315 - Mar. 31, 2009 PTO Office Action.
U.S. Appl. No. 11/418,318 - Mar. 31, 2009 PTO Office Action.
U.S. Appl. No. 11/441,219 - Jan. 7, 2009 PTO Office Action.
U.S. Appl. No. 11/522,929 - Oct. 22, 2007 PTO Office Action.
U.S. Appl. No. 11/522,929 - Feb. 21, 2008 Response to PTO Office Action of Oct. 22, 2007.
U.S. Appl. No. 11/641,678 - Jul. 22, 2008 PTO Office Action.
U.S. Appl. No. 11/641,678 - Jan. 22, 2009 Response to Office Action of Jul. 22, 2008.
U.S. Appl. No. 11/711,000 - Mar. 6, 2009 PTO Office Action.
U.S. Appl. No. 11/716,552 - Feb.12, 2009 Response to PTO Office Action of Feb. 9, 2009.
U.S. Appl. No. 11/716,552 - Jul. 3, 2008 PTO Office Action.

* cited by examiner

TRANSMISSION OF DATA BETWEEN MICROCHIPS USING A PARTICLE BEAM

COPYRIGHT NOTICE

A portion of the disclosure of this patent document contains material which is subject to copyright or mask work protection. The copyright or mask work owner has no objection to the facsimile reproduction by anyone of the patent document or the patent disclosure, as it appears in the Patent and Trademark Office patent file or records, but otherwise reserves all copyright or mask work rights whatsoever.

RELATED APPLICATIONS

The present invention is related to the following co-pending U.S. Patent applications, each which is commonly owned with the present application at the time of filing, and the entire contents of each of which are incorporated herein by reference:

1. U.S. application Ser. No. 10/917,571, filed on Aug. 13, 2004, entitled "Patterning Thin Metal Film by Dry Reactive Ion Etching"
2. U.S. application Ser. No. 11/203,407, filed Aug. 15, 2005, entitled "Method of Patterning Ultra-Small Structures,"
3. U.S. application Ser. No. 11/243,476, filed Oct. 5, 2005, entitled, "Structure and Methods for Coupling Energy from an Electromagnetic Wave;"
4. U.S. application Ser. No. 11/243,477, filed Oct. 5, 2005, entitled, "Electron Beam Induced Resonance;"
5. U.S. application Ser. No. 11/238,991, filed Sep. 30, 2005, entitled, "Light Emitting Free-Electron Micro-Resonant Structure;"
6. U.S. application Ser. No. 11/302,471, filed Dec. 14, 2005, entitled, "Coupled Nano-Resonating Energy Emitting Structures;"
7. U.S. application Ser. No. 11/325,432, filed Jan. 5, 2006, entitled, "Resonant Structure-Based Display;"
8. U.S. application Ser. No. 11/325,448, filed Jan. 5, 2006, entitled, "Selectable Frequency Light Emitter;"
9. U.S. application Ser. No. 11/325,571, filed Jan. 5, 2006, entitled, "Switching Micro-Resonant Structures by Modulating a Beam of Charged Particles;" and
10. U.S. application Ser. No. 11/325,534, filed Jan. 5, 2006, entitled, "Switching Micro-Resonant Structures Using at Least One Director."

FIELD OF THE INVENTION

This relates, in general, to microcircuits and, more particularly, to electrically coupled microcircuits.

INTRODUCTION & BACKGROUND

Semiconductor manufacturers are constantly striving to keep up with the increasing speed and number of signals coupled between microcircuits. For example, a microcircuit, such as a microprocessor, can contain billions of transistors with clock speeds greater than three gigahertz. Typically, the signals are routed between microcircuits using metal tracing or metallization systems that can include a plurality of solder balls, wire bonds, bonding pads and the like. The focus of semiconductor manufacturers has been to decrease gate delays within the microcircuits. As a result, the gate delays are now generally less than the delays contributed by the metallization system including the structures for coupling signals between the microcircuits. Thus, because of an increasing demand for smaller and faster microcircuits, there is a need to improve the structures utilized for signal coupling.

A component can include a microcircuit contained within an individual package. When mounted on a printed circuit board (PCB), the component generally provides poor utilization of space, because the microcircuits are generally smaller than the packages that contain them. Further, signal delays have occurred due to the relatively large space between the individual microcircuits contained within the package, so multi-chip module (MCM) and/or system in a package (SIP) designs are used to reduce the required space and the signal delays because the microcircuits are not contained within individual packages. For example, FIG. 1 is an enlarged top-view of a portion of a conventional device 10, or multi-chip module, illustrating a substrate 2 having a surface 25, which can harbor a plurality of microcircuits 7. Typically, the MCM or device 10 can comprise a combination of microcircuits of various semiconductor technologies that can be used to optimize the overall performance. The substrate 2 can contain a plurality of conductive layers (not shown) and typical electrical interfaces between the microcircuits and a printed circuit board. Metal connections or wire bonds are normally used to electrically couple a signal or power between the substrate 2 and the plurality of microcircuits 7. For example, a microcircuit 6 can use a wire bond 16 between bonding pads 14 and 15 on the substrate 2 and the microcircuit 6, respectively. Similarly, a microcircuit 8 can be electrically coupled by a wire bond 20 to the connection on a bonding pad 9 on the substrate 2. Hence, any power or signal received or transferred between the microcircuits 6 and 8 is coupled through wire bonds. As the demand for performance continues, the speed and density of the microcircuits will continue to increase, requiring further scaling of devices. Thus, greater demand for electrical coupling between microcircuits is anticipated.

We describe a structure for electrically coupling across a microcircuit or between microcircuits using a charged particle beam. Electrical coupling includes transferring power and/or a data signal on the charged particle beam. The data signal can be coupled by modulating the charged particle beam. Modulation can include pulsing, deflecting or shaping the charged particle beam. The charged particle beam carrying the signal can be deflected or routed to a particular location across or between microcircuits. The structure can be formed on the microcircuit or microcircuits in a final metallization step of the fabrication process.

BRIEF DESCRIPTION OF THE DRAWINGS

The following description, given with respect to the attached drawings, may be better understood with reference to the non-limiting examples of the drawings, wherein.

DETAILED DESCRIPTION OF THE PRESENTLY PREFERRED EXEMPLARY EMBODIMENTS

In the following detailed description, taken in conjunction with the accompanying drawing figures, like reference numbers designate like elements.

Generally, a device and method for electrically coupling across a microcircuit or between microcircuits using a charged particle beam is described. The device can be formed on at least one microcircuit of a system in a package, or a multi-chip module. The MCM can comprise a plurality of microcircuits, including first and second microcircuits. An emitter can be formed on the first microcircuit and can generate a charged particle beam along quasi one-dimensional paths. A modulator can be formed on the first microcircuit to couple data onto the charged particle beam. A deflector and collector for routing and receiving the charged particle beam, respectively, can be formed on the first microcircuit or a second microcircuit. The emitter, modulator, collector and the deflector can be formed in a final metallization step in the fabrication of the microcircuit(s).

As described here, a charged particle beam can include positively or negatively charged ions, electrons and the like. The type of particles is not limiting. For the purposes of this description, the charged particle beam is referred to as an electron beam.

Figure 1:
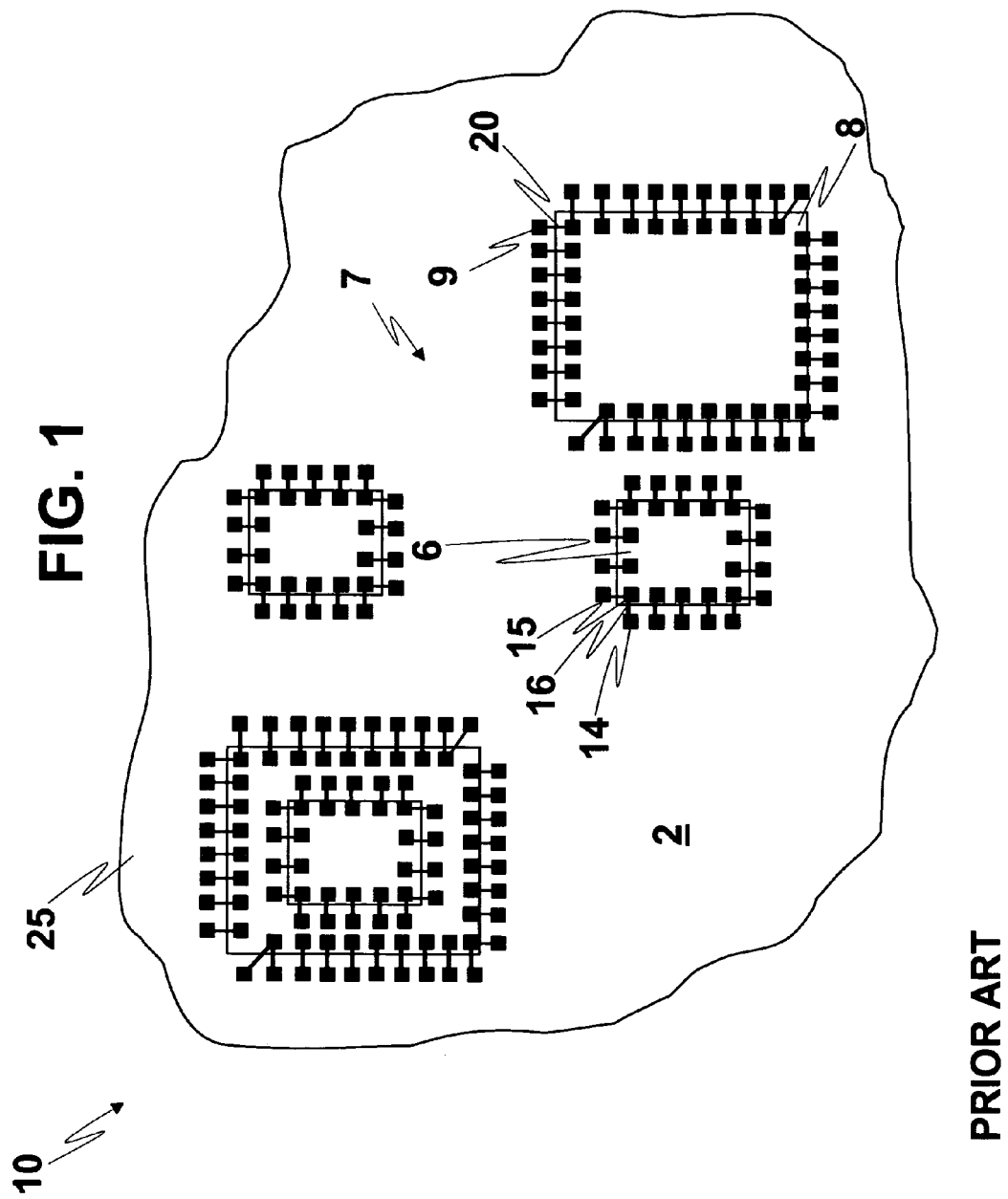
FIG. 1 is an enlarged top-view of a portion of a prior art multi-chip module.
Figure 2:
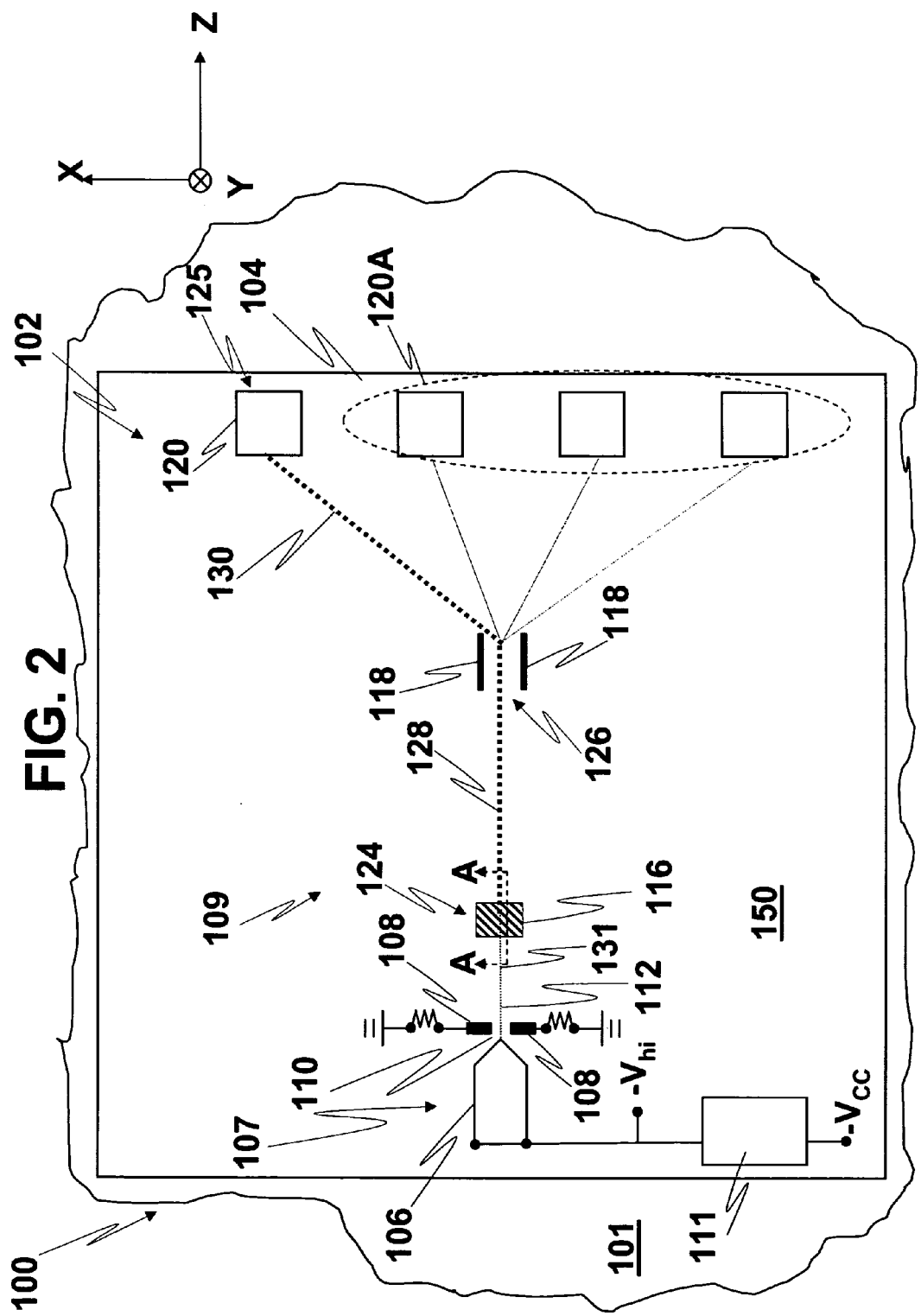
FIG. 2 is a general overview of a microcircuit.

FIG. 2 illustrates a general overview of a device 100 for coupling a data signal 124 across a microcircuit 102. The microcircuit 102 can be made from a substrate 150 having a surface 104 and is shown formed on a portion of a substrate 101 of a multi-chip module. The device 100 can be formed in a variety of arrangements and is not limiting. For example, the device 100 can include an individual microcircuit 102 formed on a printed circuit board. The microcircuit 102 can include a range of technologies such as CMOS, BiCMOS, bipolar, and the like. The technology and logic family of the microcircuit 102 is not limiting. The substrate 150 can include compound semiconductors, silicon-on-insulator, silicon-on-sapphire, silicon-on-spinel, silicon-on-nitride, silicon-on-oxide, and is not limiting. (As is known in the art, "spinel" refers to magnesium aluminum oxide, $MgAl_2O_4$.)

An emitter or source 107 can be formed on the surface 104 in a final process metallization step and includes a cathode 106 and an anode 108 having an aperture or opening 110. The source 107 provides a charged particle beam (generally referred to herein as an electron beam 112). A space 109 above the surface 104 for transferring the electron beam 112) should normally be under a sufficient vacuum to prevent scattering of the electron beam 112. The cathode 106 can be connected to a negative voltage with respect to the anode 108. Here, for example, the cathode 106 is connected to a negative high voltage ($-V_{hi}$), and the anode 108 is resistively coupled to ground or zero potential. Electrons are emitted from the cathode 106 and a substantial number pass through the opening 110 of the anode 108 to form the electron beam 112, which follows a quasi one-dimensional path 131 (i.e., in the Z-direction).

A DC-to-DC converter 111 is shown disposed on the surface 104 of the microcircuit 102 and can be used to provide the negative high-voltage ($-V_{hi}$) to the cathode 106. The DC-to-DC converter 111 can receive power from a voltage source negative $V_{CC}$. The negative high voltage ($-V_{hi}$) of the DC-to-DC converter 111 can include a range of voltages from about −200 volts to about −3000 volts. The DC-to-DC converter 111 can include fly-back and forward type configurations and is not limiting. In another embodiment, a layer (not shown) within a substrate can be isolated to provide a high-voltage to a cathode.

Figure 3:
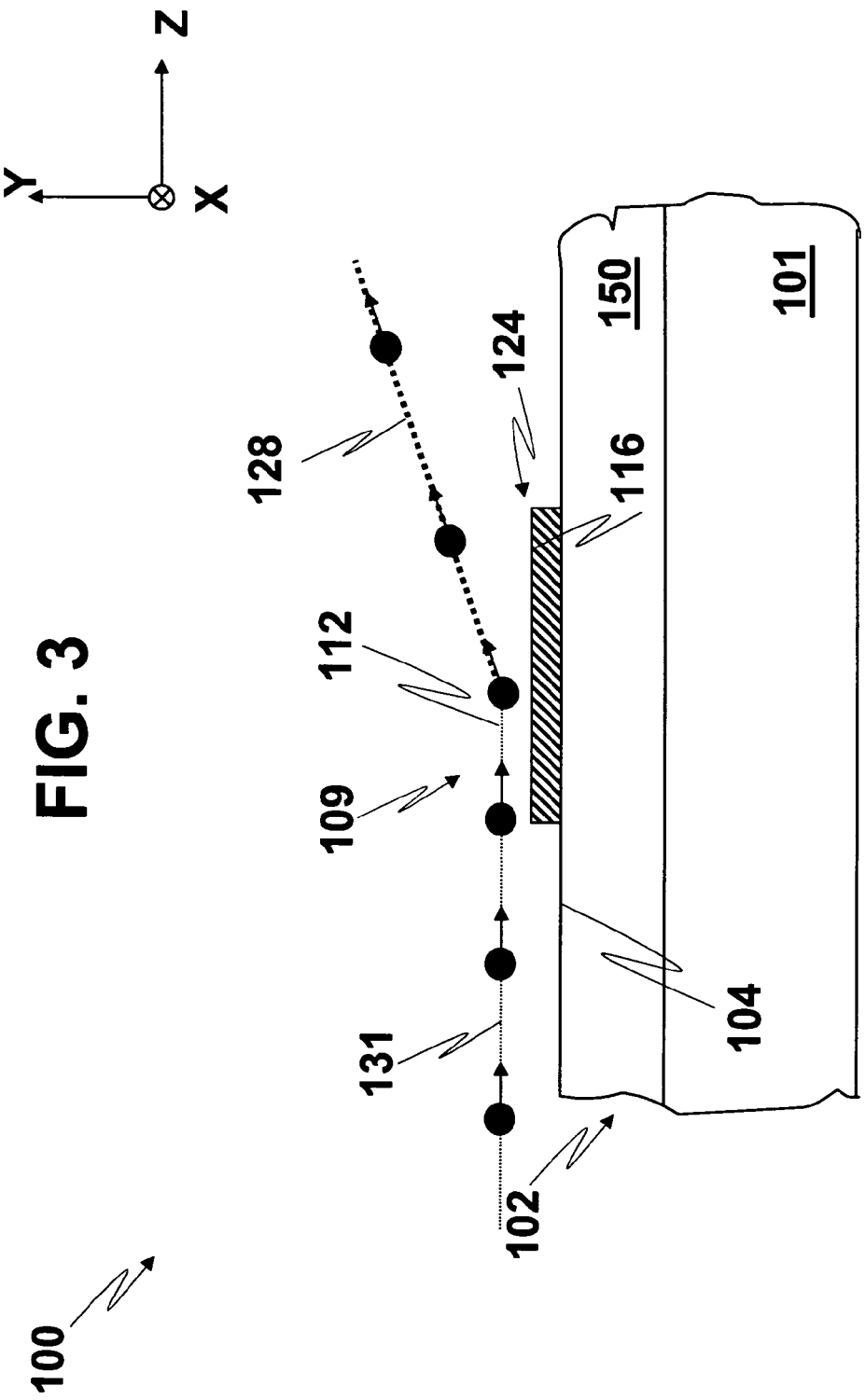
FIG. 3 is a portion of FIG. 2 illustrating a modulator.

FIG. 3 is a cross sectional side-view (A-A) of a portion of the device 100 shown in FIG. 2 and illustrates a modulator or metal pad 116 for coupling the data signal 124 onto the electron beam 112. In one embodiment, the metal pad 116 can be formed on the surface 104 in a final metallization step in the fabrication of the microcircuit 102. The metal pad 116, for example, can be formed in a vicinity of the source 107, e.g., within a range of about twenty microns to about one millimeter. The data signal 124 can be coupled to the metal pad 116 by a direct physical connection or by induction. The electron beam 112 is shown passing through the space 109 along the path 131 over the metal pad 116, which is electrically charged by a voltage from the data signal 124. This can cause Coulombic forces to deflect the electron beam 112 and is often referred to in the art as coulomb scattering. For example, the electron beam 112 is shown deflected up or vertically (i.e., in the Y-direction) along a path 128 on applying the data signal 124 to the metal pad 116, which can be negatively charged. The magnitude of the deflection of the electron beam 112 is a function of the charge or the voltage of the data signal 124 applied to the metal pad 116. The data signal 124 can have a voltage above or below a selected threshold voltage to establish a "one" or "zero" logic state, respectively.

Referring again to FIG. 2, deflectors or routers 118 are shown formed on the surface 104 of the microcircuit 102 between the metal pad 116 and a collector or receiver 120. The routers 118 can include a pair of metal structures or plates separated by a space, and are coupled to a voltage or a control signal 126. An electric field is generated between the plates or routers 118 by the voltage of the control signal 126. The electron beam 112 travels through the electric field between the routers 118. By increasing the voltage or control signal 126 across the routers 118, a force from the electric field can proportionally deflect the electron beam 112. Hence, the electron beam 112, now modulated, can be routed or directed along a path 130 to a particular location. Similar to the metal pad 116, the routers 118 can be formed in a final metallization step.

The receiver 120 and a plurality of other receivers (generally denoted 120A) can be formed on the surface 104 of the microcircuit 102 and are for receiving the electron beam 112. The receivers 120 and 120A, for example, can be coupled to logic gates, operational amplifiers and passive elements of the microcircuit 102. For example, the particular location (above) for directing the electron beam 112 is illustrated in the drawing as the receiver 120. As shown, the signal 126 can be applied to the routers 118 and deflected to route the electron beam 112 to any of the receivers 120 and 120A. The receiver 120 can include collectors such as, e.g., Faraday cups or other structures, to electrically couple an output data signal 125 and power from the electron beam 112, and can be formed in a final metallization step of the fabrication process. The electron beam 112 has the advantage of communicating and/or coupling power across the microcircuit 102 without the use of a metal connection or metallization.

Figure 4:
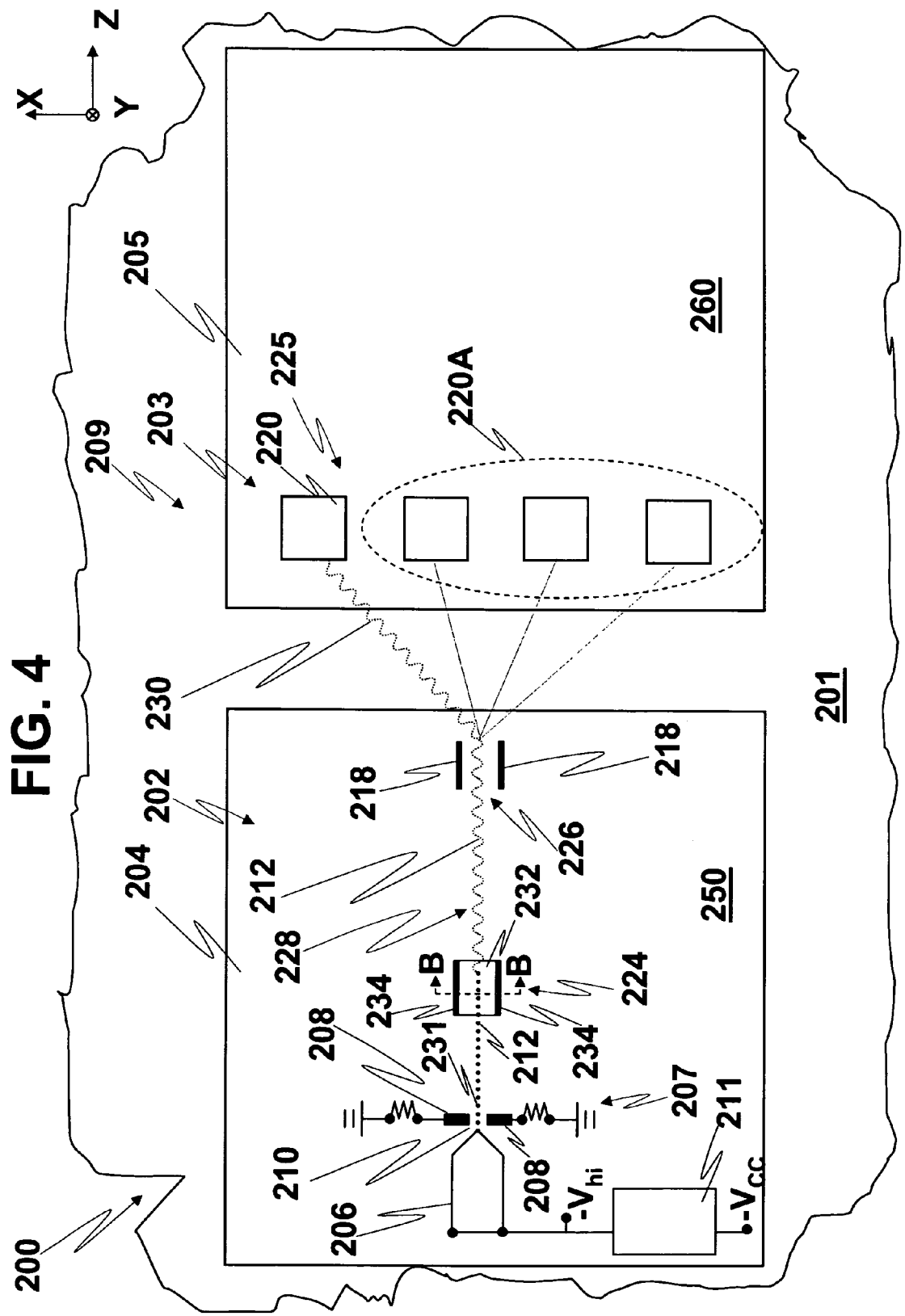
FIG. 4 is a general overview of two microcircuits.

FIG. 4 illustrates a general overview of a device 200 for coupling a data signal 224 between microcircuits 202 and 203. The microcircuits 202 and 203 can be made from respective substrates 250 and 260. The substrates 250 and 260 having respective surfaces 204 and 205 are shown formed on a portion of a substrate 201 of a multi-chip module. The device 200 can be formed in a variety of arrangements and is not limiting. For example, the device 200 can include an individual microcircuit (not shown) formed on a printed circuit board. The microcircuits 202 and 203 can include a range of technologies such as CMOS, BiCMOS, bipolar, and the like. The technology and logic family of the microcircuits 202 and 203 is not limiting. The substrates 250 and 260 can include compound semiconductors, silicon-on-insulator, silicon-on-sapphire, silicon-on-spinel, silicon-on-nitride, silicon-on-oxide and is not limiting.

An emitter or source 207 can be formed on the surface 204 in a final process metallization step and includes a cathode 206 and an anode 208 having an aperture or opening 210. The source 207 provides a charged particle beam (referred to as an electron beam 212). A space 209 between and above the surfaces 204 and 205 for transferring the electron beam 212 should normally be under a sufficient vacuum to prevent scattering or disruption of the electron beam 212. The cathode 206 can be connected to a DC-to-DC converter 211, similarly as discussed with reference to FIG. 2, to provide a negative high-voltage ($-V_{hi}$) with respect to the anode 208, which can be resistively coupled to ground or zero potential.

Figure 5:
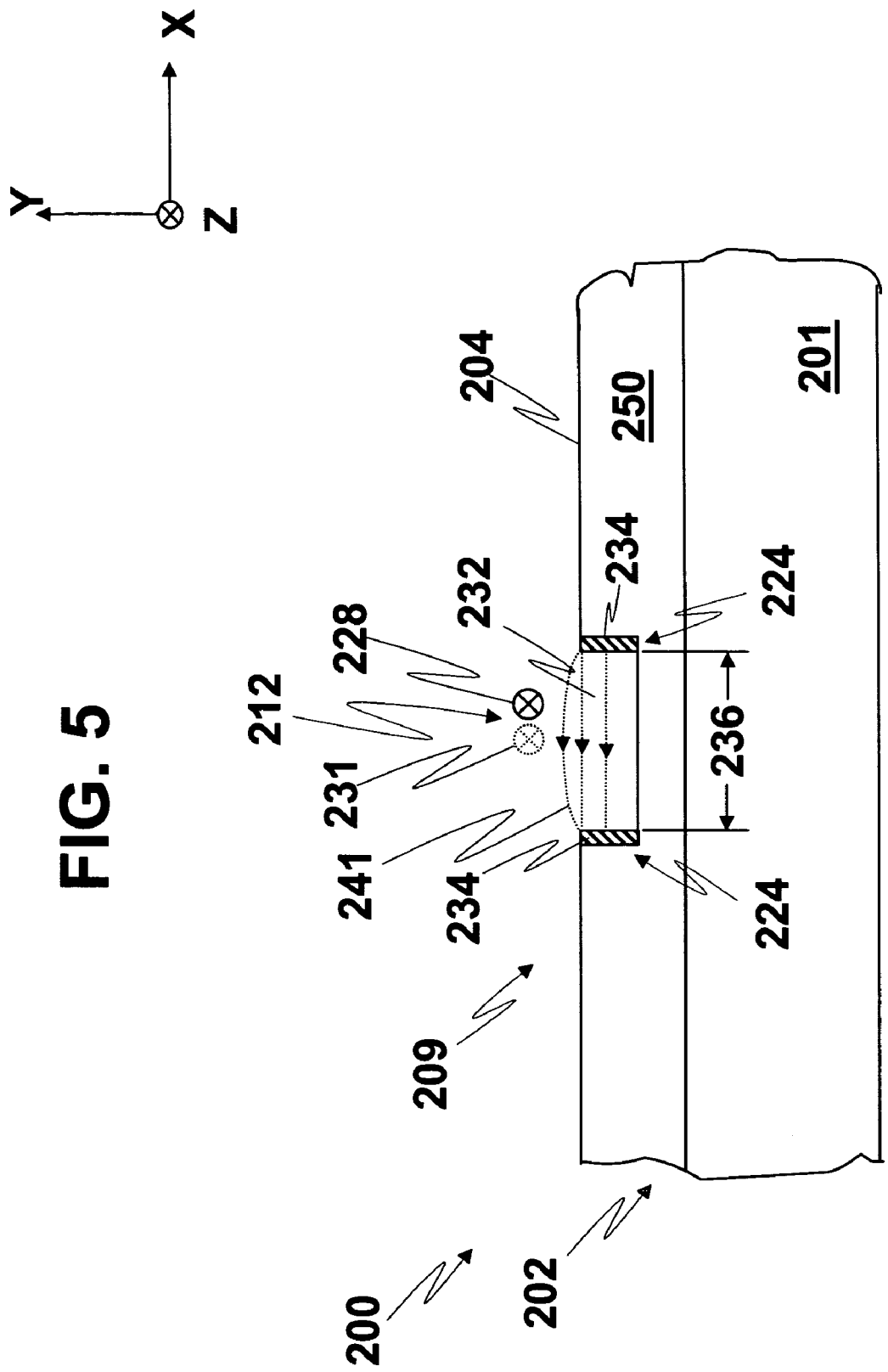
FIG. 5 is a portion of FIG. 4 illustrating a modulator.

FIG. 5 is a cross sectional side-view (B-B) of a portion of the device 200 shown in FIG. 4 and illustrates a modulator or metal sidewalls 234 for coupling the data signal 224 onto the electron beam 212. A cavity 232 can be formed in the substrate 250 using, for example, an anisotropic reactive ion-etch. A pair of opposite sides of the cavity 232 includes a metal layer that forms the metal sidewalls 234. The orientation of the metal sidewalls 234 is generally parallel to the path 231 of the electron beam 212. The metal sidewalls 234 can be formed in a final metallization step in the processing of the microcircuit 202. The data signal 224 can couple a voltage to the metal sidewalls 234. The cavity 232 and metal sidewalls 234, for example, can be formed in a vicinity of the source 207 within a range of about twenty (20) microns to about one (1) millimeter. With no data signal 224 or voltage applied to the metal sidewalls 234, the electron beam 212 follows the path 231. When a voltage is applied to the sidewalls 234 by the data signal 224, an electric field 241 forms between the sidewalls 234 and in a portion of the space 209 above the cavity 232. The electric field 241 that extends in the portion of the space 209 above the cavity 232 is referred to as a fringing field. By increasing the area of the sidewalls 234 in relation to a distance 236 between the sidewalls 234, the fringing field can be increased. The electric field 241 and particularly the fringing field deflects the electron beam 212 horizontally (i.e., the X-direction as shown) to travel along a path 228. The data signal 224 can be made to vary (e.g., sinusoidally). The electric field 241 is generally a function of the data signal 224 and can change the shape or direction of the electron beam 212. As shown, the electric field 241 deflects the electron beam 212 from side to side. For example, the data signal 224 can be set to oscillate at a primary frequency of 1 megahertz (MHz) to establish a "zero" logic state and at a secondary frequency of 5 MHz to establish a "one" logic state.

Referring again to FIG. 4, deflectors or routers 218 are shown formed on the microcircuit 202 between the source 207 and a collector or receiver 220. The routers 218 function and can be made similar to the routers 118 shown in FIG. 2. Similar to the device shown in FIG. 2, a signal 226 can be applied to the routers 218. The electron beam 212 can be deflected by the routers 218 and channeled or directed along a path 230 to a particular location such as the receiver 220 or to any one of a plurality of receivers 220A on the microcircuit 203. The receiver 220, for example, can include a collector such as, e.g., a Faraday cup or other structures, and can couple an output data signal 225 to logic gates, operational amplifiers and passive elements of the microcircuit 203. Hence, the electron beam 212 can communicate and/or couple power between microcircuits 202 and 203 without the use of a metal connection or metallization.

Figure 6:
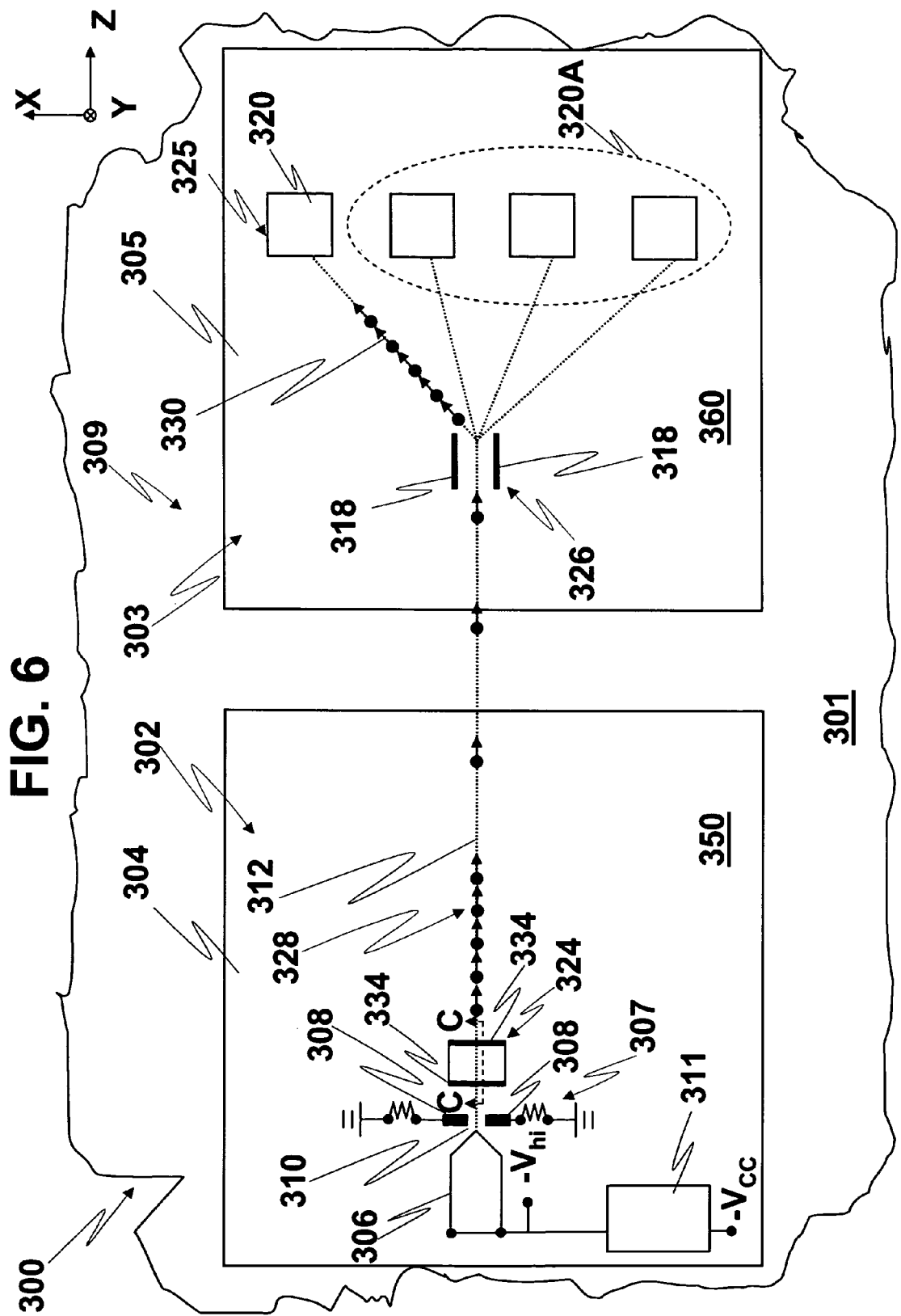
FIG. 6 a general overview of another embodiment of two microcircuits.

FIG. 6 illustrates a general overview of a device 300 for coupling a data signal 324 between microcircuits 302 and 303. The microcircuits 302 and 303 can be made from respective substrates 350 and 360. The substrates 350 and 360 having respective surfaces 304 and 305 are shown formed on a portion of a substrate 301 of a multi-chip module. The device 300 can be formed in a variety of arrangements and is not limiting. For example, the device 300 can include an individual microcircuit (not shown) formed on a printed circuit board. The microcircuits 302 and 303 can include a range of technologies such as CMOS, BiCMOS, bipolar, and the like. The technology and logic family of the microcircuits 302 and 303 is not limiting. The substrates 350 and 360 can include compound semiconductors, silicon-on-insulator, silicon-on-sapphire, silicon-on-spinel, silicon-on-nitride, silicon-on-oxide, and is not limiting.

An emitter or source 307 can be formed on the surface 304 in a final process metallization step and includes a cathode 306 and an anode 308 having an aperture or opening 310. The source 307 provides a charged particle beam (referred to as an electron beam 312). A space 309 between and above the surfaces 304 and 305 for transferring the electron beam 312 should normally be under a sufficient vacuum to prevent scattering of the electron beam 312. The cathode 306 can be connected to a DC-to-DC converter 311, (in a manner similar to that described with reference to the devices in FIGS. 2 and 4), to provide a negative high-voltage ($-V_{hi}$) with respect to the anode 308, which can be resistively coupled to ground or zero potential.

Figure 7:
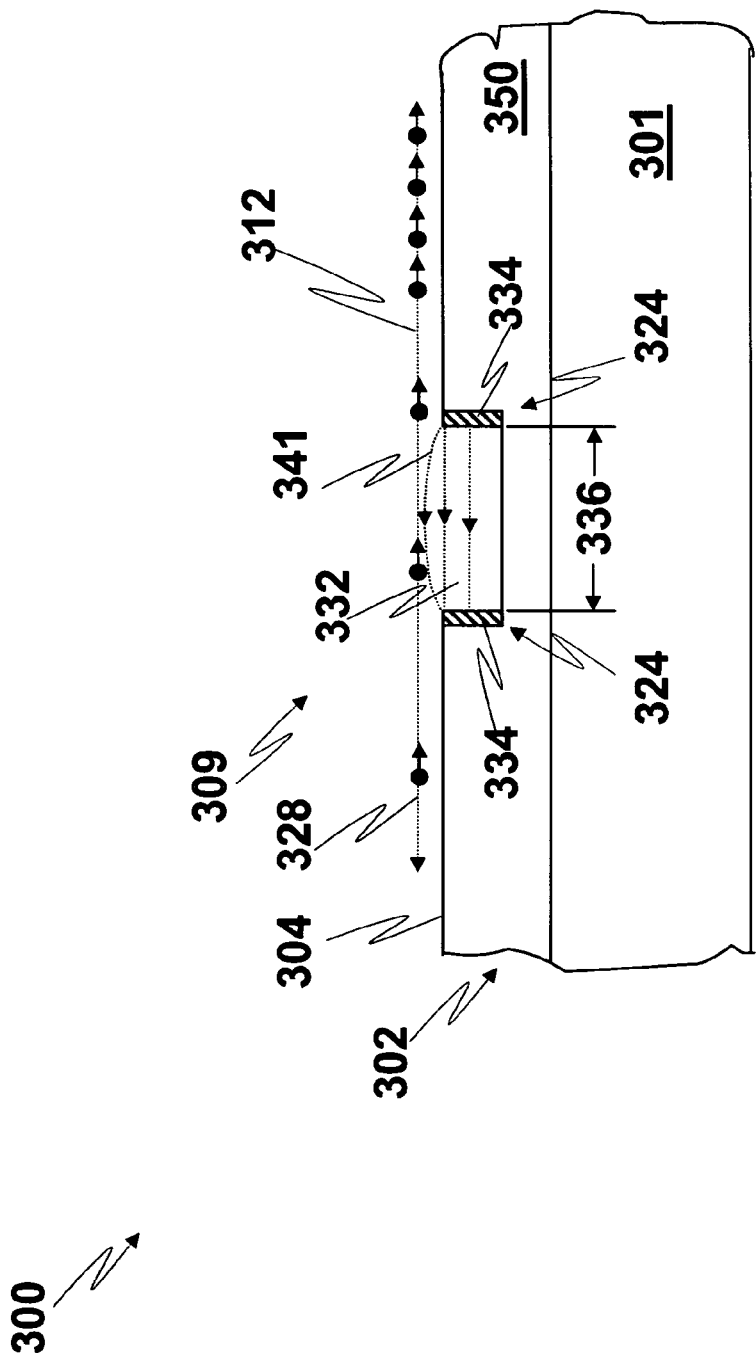
FIG. 7 is a portion of FIG. 6 illustrating yet another modulator.

FIG. 7 is a cross sectional side-view (C-C) of a portion of the device 300 shown in FIG. 6, and illustrates a modulator or metal sidewalls 334 for coupling the data signal 324 onto the electron beam 312. A cavity 332 is formed in the substrate 350 and can be formed similarly (as described with reference to the device of FIG. 5). A pair of opposite sides of the cavity 332 includes a metal layer that forms the metal sidewalls 334. The orientation of the metal sidewalls 334 is generally transverse to the path 328 of the electron beam 312. The metal sidewalls 334 can be formed in a final metallization step in the processing of the microcircuit 302. The cavity 332 and metal sidewalls 334, for example, can be formed in a vicinity of the source 307 within a range of about twenty (20) microns to about one (1) millimeter. A voltage from the data signal 324 can be coupled to the metal sidewalls 334. As a result, an electric field 341 can extend between the sidewalls 334 and can include a fringing field as discussed with reference to FIG. 5 in a portion of the space 309 above the cavity 332. On traveling over the cavity 332 (i.e., in the Z-direction as shown), the electron beam 312 is generally parallel to the electric field 341. By convention, the direction of the electric field 341 is shown in terms of forces acting on a positive charge. Thus, as shown in FIG. 7, the electrons of the electron beam 312 are accelerated by the electric field 341. A distance 336 across the cavity 332 in relation to the frequency of the data signal 324 can cause electrons of the electron beam 312 to change velocity a plurality of times. A portion of the electrons of the electron beam 312 is sped up and another portion is slowed down. After traveling over the cavity 332, the portion of electrons that were sped up generally overtakes the portion of electrons that were slowed down. This can result in bunching and spreading out of the electrons of the electron beam 312 and is frequently referred to as velocity modulation. For example, the data signal 324 can be set to establish a particular density threshold of the electron beam 312. Detection above or below the density threshold can establish a "one" or "zero" logic state, respectively.

Referring again to FIG. 6, deflectors or routers 318 are shown formed the surface 305 of the microcircuit 303 between the source 307 and a collector or receiver 320. The routers 318 function and can be made in a manner similar to the routers 118 and 218 with reference to the devices shown in FIGS. 2 and 4, respectively. As with the devices of FIGS. 2 and 4, a signal 326 can be applied to the routers 318. The electron beam 312 can be deflected by the routers 318 and channeled or directed along a path 330 to a particular location such as a receiver 320 or to any one of a plurality of receivers 320A on the microcircuit 303. The receiver 320, for example, can include a collector such as, e.g., a Faraday cup or other structures and can couple an output data signal 325 to logic gates, operational amplifiers and passive elements of the microcircuit 303. Hence, the electron beam 312 communicates and/or couples power between the microcircuits 302 and 303 without the use of a metal connection or metallization.

Figure 8:
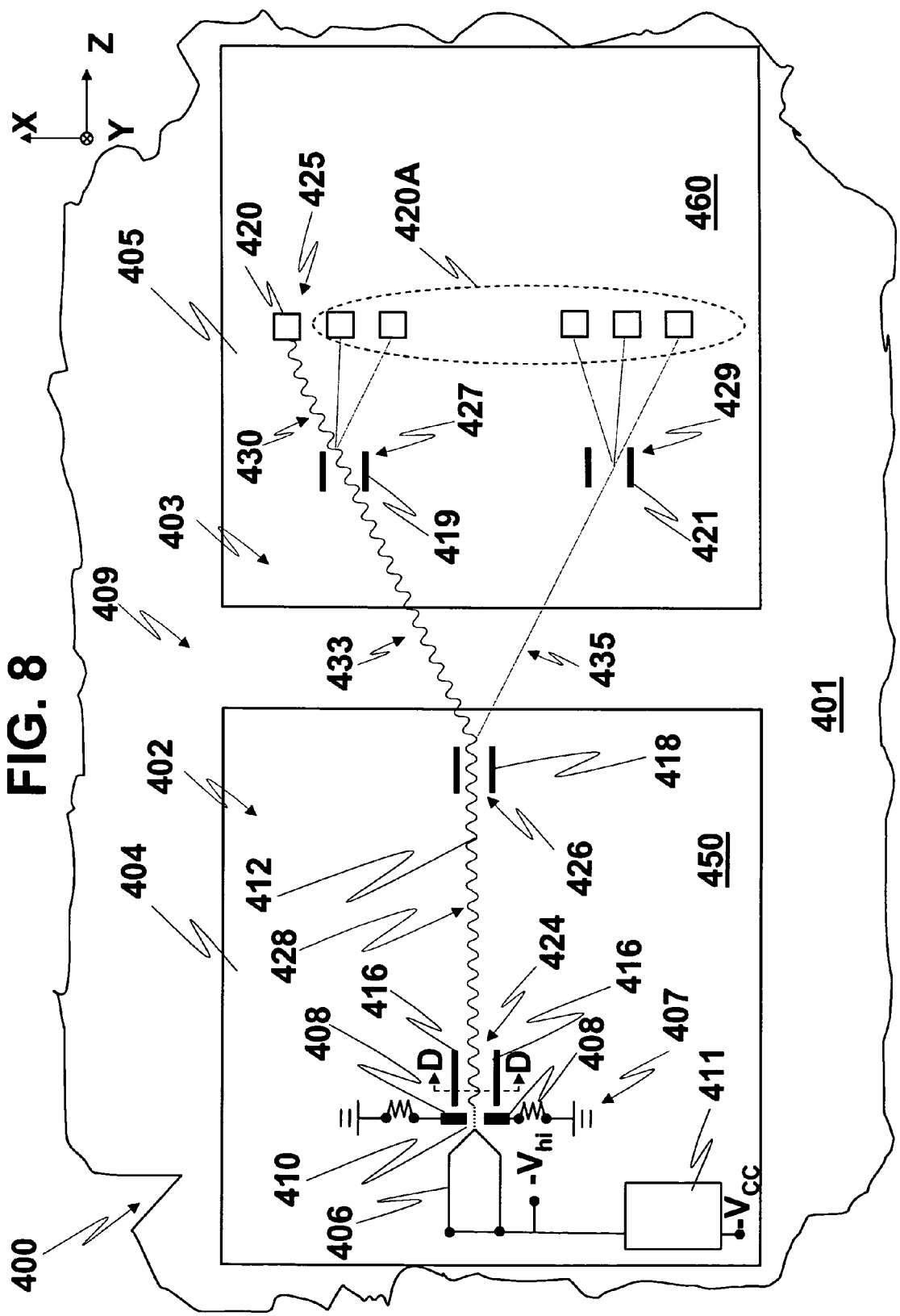
FIG. 8 a general overview of two microcircuits.

FIG. 8 shows a general overview of one embodiment of a device 400 for coupling a data signal 424 between the microcircuits 402 and 403. The microcircuits 402 and 403 can be made from respective substrates 450 and 460. The substrates 450 and 460 are shown formed on a portion of a substrate 401 of a multi-chip module and have surfaces 404 and 405, respectively. The device 400 can be formed in a variety of arrangements and is not limiting. For example, the device 400 can include an individual microcircuit (not shown) formed on a printed circuit board. The microcircuits 402 and 403 can include a range of technologies such as CMOS, BiCMOS, bipolar, and the like. The technology and logic family of the microcircuits 402 and 403 is not limiting. The substrates 450 and 460 can include compound semiconductors, silicon-on-insulator, silicon-on-sapphire, silicon-on-spinel, silicon-on-nitride, silicon-on-oxide, and is not limiting.

An emitter or source 407 can be formed on the surface 404 in a final metallization step and includes a cathode 406 and an anode 408 having an aperture or opening 410. The source 407 provides a charged particle beam (referred to as an electron beam 412). A space 409 between and above the surfaces 404 and 405 for transferring the electron beam 412 should normally be under a sufficient vacuum to prevent scattering of the electron beam 412. The cathode 406 can be connected to a DC-to-DC converter 411, similarly as discussed with reference to the devices shown in FIGS. 2, 4 and 6 to provide a negative high-voltage ($-V_{hi}$) with respect to the anode 408, which can be resistively coupled to ground or zero potential.

Figure 9:
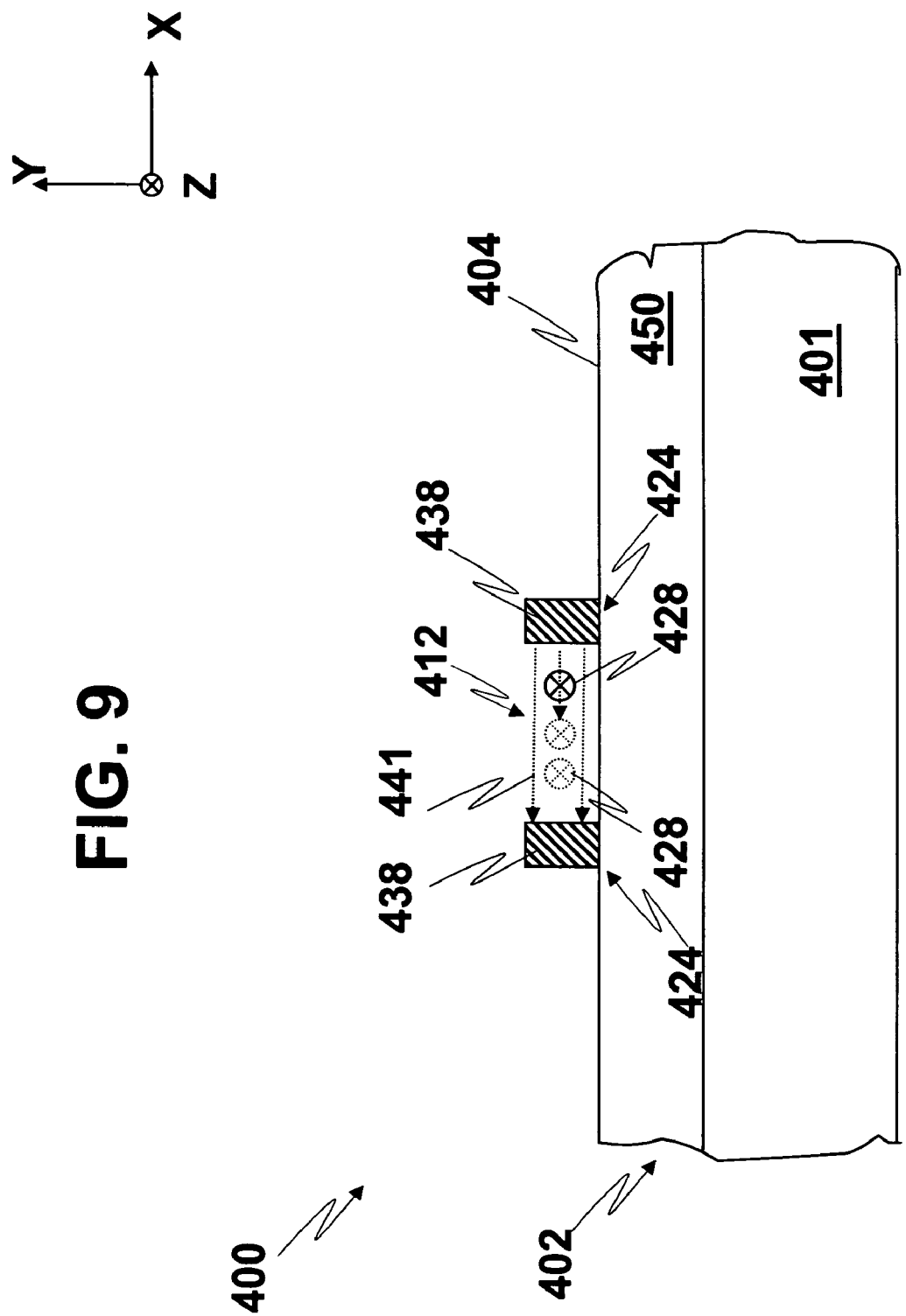
FIG. 9 is a portion of FIG. 8 illustrating yet another modulator.

FIG. 9 is a cross sectional side-view (D-D) of a portion of the device 400 illustrated in FIG. 8 and shows a modulator or a pair of electrically conductive structures or structures 438 for coupling the data signal 424 onto the electron beam 412. The structures 438 can be formed on the surface 404 in a final metallization step in the processing of the microcircuit 402. The structures 438, for example, can be formed in a vicinity of the source 407 within a range of about 20 microns to about 1 millimeter. The data signal 424 can be applied across the structures 438, thereby establishing an electric field 441 between the structures 438. The electric field 441 can change direction as a function of the data signal 424 applied to the structures 438 and can change the shape or direction of the electron beam 412. As shown, the electric field 441 deflects the electron beam 412 side to side. Similar to the device shown in FIG. 5, the electron beam 412 can be modulated as a sinusoidal function.

Now referring again to FIG. 8, deflectors or routers 418 are shown formed on the surface 404 the microcircuit 402. The routers 418 function and can be made similar to the routers 118 and 218, 318 of FIGS. 2, 4, and 6, respectively. In FIG. 8, similar to FIGS. 2, 4 and 6, a signal 426 can be applied to the routers 418. Further, top and bottom deflectors or respective routers 419 and 421 are formed on the surface 405 of the microcircuit 403. The electron beam 412 can be deflected by the routers 418 and directed along paths 433 and 435 to a particular location such as routers 419 and 421, respectively. As shown in FIG. 8, the electron beam 412 can be deflected by the routers 419 and channeled or directed along a path 430 to another particular location such as, e.g., a collector or receiver 420. Further, the electron beam 412 can be directed by routers 419 and 421 (using respective control signals 427 and 429) to any one of a plurality of receivers 420A on the microcircuit 403. The receiver 420, for example, can include a collector such as, e.g., a Faraday cup or the like, and can couple an output data signal 425 to logic gates, operational amplifiers and passive elements of the microcircuit 403. Hence, the electron beam 412 can communicate and/or couple power between microcircuits 402 and 403 without the use of a metal connection or metallization.

Figure 10:
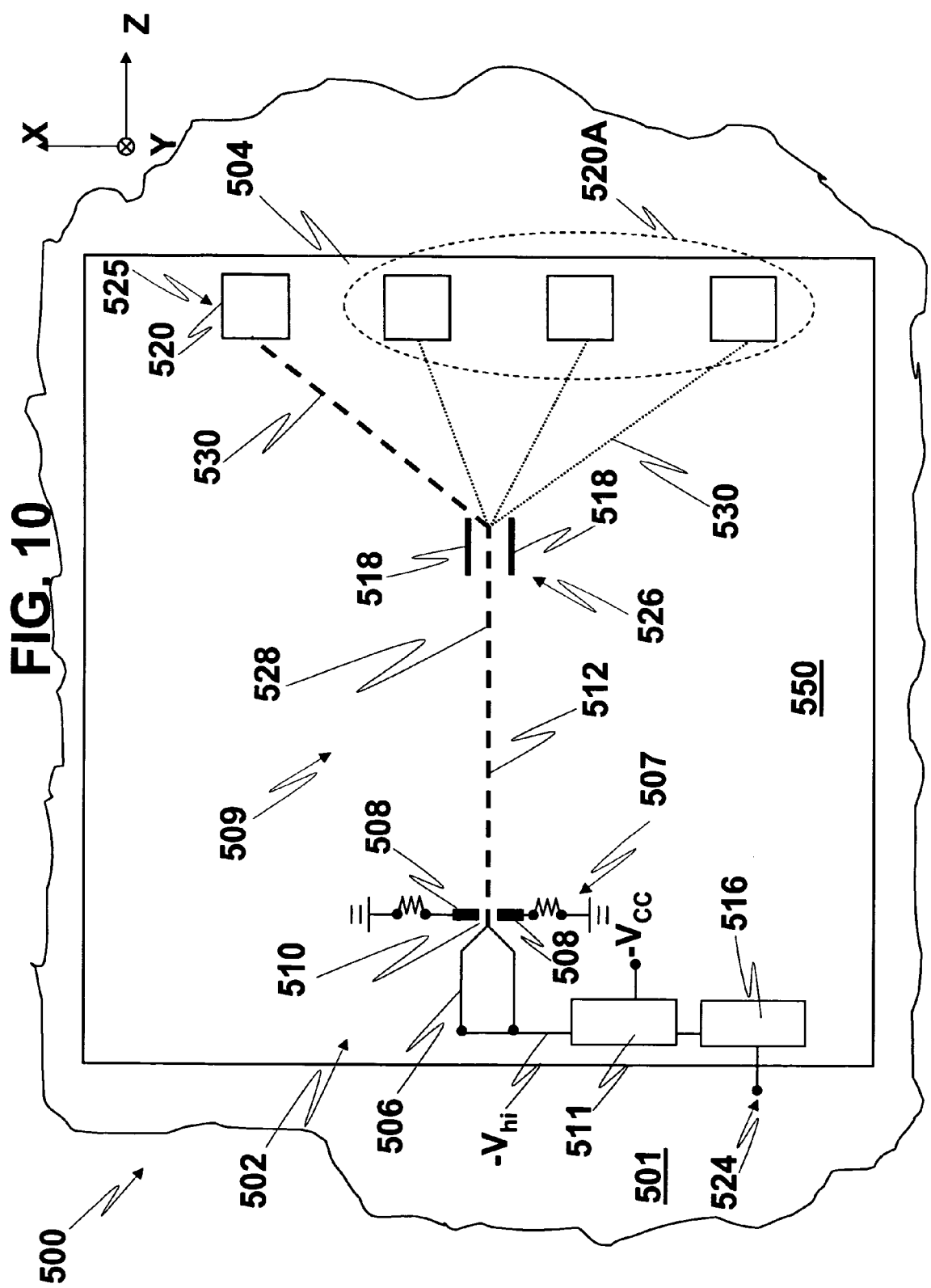
FIG. 10 is a general overview of another microcircuit.

FIG. 10 shows a general overview of a device 500 for coupling a data signal 524 across a microcircuit 502. The microcircuit 502 can be made from a substrate 550. The substrate 550 having a surface 504 is shown formed on a portion of a substrate 501 of a multi-chip module. The device 500 can be formed in a variety of arrangements and is not limiting. For example, the device 500 can include an individual microcircuit (not shown) formed on a printed circuit board. The microcircuit 502 can include a range of technologies such as CMOS, BiCMOS, bipolar, and the like. The technology and logic family of the microcircuit 502 is not limiting. The substrate 550 can include compound semiconductors, silicon-on-insulator, silicon-on-sapphire, silicon-on-spinel, silicon-on-nitride, silicon-on-oxide, and is not limiting.

An emitter or source 507 can be formed on the surface 504 in a final metallization step and includes a cathode 506 and an anode 508 having an aperture or opening 510. The source 507 provides a charged particle beam (referred to as an electron beam 512). A space 509 above the surface 504 for transferring the electron beam 512 should normally be under a sufficient vacuum to prevent scattering of the electron beam 512. The cathode 506 can be connected to a negative high-voltage ($-V_{hi}$) with respect to the anode 508. Here, for example, the cathode 506 is connected to a voltage ($-V_{hi}$), and the anode 508 is resistively coupled to ground or zero potential. Electrons are emitted from the cathode 506 and a substantial number pass through the opening 510 of the anode 508 to form the electron beam 512, which follows a quasi one-dimensional path (i.e., in the z-direction).

A DC-to-DC converter 511 is shown disposed on the surface 504 of the microcircuit 502 and can be used to provide the negative high-voltage ($-V_{hi}$) to the cathode 506. The high voltage of the DC-to-DC converter 511 can include a range of voltages from about −200 volts to about −30000 volts. The DC-to-DC converter 511 can include fly-back and forward type configurations and is not limiting. In another embodiment, a layer (not shown) within the substrate can be isolated to provide the high-voltage to the cathode.

A modulator or switching circuit 516 is coupled to the DC-to-DC converter 511. The data signal 524 can control the duty ratio or cycle of the DC-to-DC converter 511. Thus, the data signal 524 can pulse the output of the DC-to-DC converter 511, thereby modulating the electron beam 512.

Deflectors or routers 518 are formed on the surface 504 of the microcircuit 502 between the source 507 and a collector or receiver 520. The routers 518 can include a pair of metal structures or plates separated by a space, and are connected to a voltage or a control signal 526. Similar, for example, to the device in FIG. 2, the routers 518 can channel or direct the electron beam 512 along a path 530 to a particular location such as a receiver 520 and to any one of a plurality of receivers 520A formed on the surface 504. The receivers 520 and 520A can include collectors such as, e.g., Faraday cups or the like formed in a final metallization step during fabrication and are for receiving the electron beam 512. The receiver 520, for example, can couple an output data signal 525 to logic gates, operational amplifiers and passive elements of the microcircuit 503. Hence, the electron beam 512 communicates and/or couples power across the microcircuit 502 without the use of a metal connection or metallization.

In another embodiment (not shown), the electron beam can be pulsed can coupled between transmitting and receiving microcircuits. Further, deflectors can be formed on either the transmitting or receiving microcircuits.

Thus, a device and method for electrically coupling across a microcircuit or between microcircuits using a charged particle beam is provided. Electrically coupling can include transferring a data signal and/or power. A final metallization step can be used to form a structure for generating a charged particle beam, which can be modulated to couple a signal within or between microcircuit(s). A collector structure can be formed in the final metallization step for receiving the charged particle beam. This device and method provides the advantage of communicating and/or coupling power without the use of a metal connection.

Those skilled in the art will realize and understand, upon reading this description, that the source of charged particles may be provided on or apart from the various microcircuits.

Methods of making a device for detecting an electromagnetic wave as can be employed herein may use, e.g., the techniques described in U.S. application Ser. No. 10/917,571, and/or U.S. application Ser. No. 11/203,407, each of which is described in greater detail above.

The devices described herein may also employ various similar or different example resonant structures to those described in one or more of the following related applications, each of which is also described in greater detail above: U.S. applications Ser. Nos. 11/243,476; 11/243,477; 11/238,991; 11/302,471; 11/325,432; 11/325,448; 11/325,571; and 11/325,534.

Various embodiments of the invention are described above. While these descriptions directly describe the above embodiments, it is understood that those skilled in the art may conceive modifications and/or variations to the specific embodiments shown and described herein. Any such modifications or variations that fall within the purview of this description are intended to be included therein as well. Unless specifically noted, it is the intention of the inventor that the words and phrases in the specification and claims be given the ordinary and accustomed meanings to those of ordinary skill in the applicable art(s). The foregoing description of a preferred embodiment and best mode of the invention known to the applicant at the time of filing the application has been presented and is intended for the purposes of illustration and description. It is not intended to be exhaustive or to limit the invention to the precise form disclosed, and many modifications and variations are possible in the light of the above teachings. It is intended that the invention not be limited to the particular embodiments disclosed for carrying out this invention, but that the invention will include all embodiments falling within the scope of the appended claims.

What is claimed is:

1. A method of communicating between a first chip and a second chip, each said chip having at least one microcircuit, the method comprising:
   providing information at the second chip for communication to the first chip;
   carrying the information in an electric signal in a metal structure;
   providing at least one receiver on said first chip; and
   encoding the information in the electric signal into a beam of charged particles by passing the beam near the metal structure; and
   directing the encoded beam to said at least one receiver on said first chip.

2. A method as in claim 1 wherein the information is recovered from the beam of charged particles at said least one receiver.

3. A method as in claim 1 wherein said beam is directed by being deflected by at least one deflection mechanism.

4. A method as in claim 3 wherein the deflection mechanism and said at least one receiver are on different chips.

5. A method as in claim 3 wherein said at least one deflection mechanism is controlled, at least in part, by said information.

6. A method as in claim 3 wherein said charged particles are selected from the group: electrons, protons, positive ions and negative ions.

7. A method as in claim 3 wherein at least two receivers are provided.

8. A method as in claim 7 wherein at least one of said receivers is operationally connected to a circuit to provide signals representing said data thereto.

9. A method as in claim 8 wherein the circuit is a microcircuit in the first chip.

10. A method as in claim 1 wherein said first and second chips are distinct chips in a multi-chip module (MCM).

11. A method as in claim 3 wherein the deflection mechanism is provided on the second chip and wherein at least two receivers are provided on the first chip, distinct from the second chip, and wherein said beam of charged particles is directed to a first one of said receivers to represent a binary one value of said information, and said beam is directed to a second one of said receivers to represent a binary zero value of said information.

12. A method as in claim 1 further comprising:
    causing said beam of charged particles to be modulated according to the information.

13. A method as in claim 12 wherein said beam of charged particles is modulated by one or more of: pulsing, deflecting, and shaping the charged particle beam.

14. A method according to claim 1, wherein the metal structure is a cavity.

15. A method according to claim 14, wherein the cavity has opposing metal sidewalls and the beam passes through the cavity near the metal sidewalls.

16. A converter according to claim 15, wherein the information in the electric signal is encoded into the charged particle beam by bunching charged particles in the beam as the beam passes through the cavity.

17. A signal format converter for inter-chip communications, comprising:
    first and second microchips, the first microchip having information for inter-chip communication to the second microchip;

a metal structure carrying the information in an electric signal;

a charged particle beam path at the first microchip for receiving a charged particle beam, wherein the charged particle beam in the path near the metal structure to cause the information in the electric signal to be encoded into the charged particle beam; and a beam director to provide the encoded charged particle beam to the second microchip.

18. A converter as in claim 17 wherein first and second microchips are distinct chips in a multi-chip module (MCM).

19. A converter as in claim 17 further comprising:

a source of charged particles for generating said charged particle beam.

20. A converter as in claim 17 wherein said charged particles are selected from the group: electrons, protons, positive ions and negative ions.

21. A converter as in claim 17 wherein at least two receivers are provided on the second microchip.

22. A converter as in claim 17 wherein said beam of charged particles is modulated according to the information.

23. A converter as in claim 17 wherein at least two receivers are provided on the second microchip, and wherein said beam of charged particles is directed to a first one of said receivers to represent a binary one value of said information, and said beam is directed to a second one of said receivers to represent a binary zero value of said information.

24. A converter according to claim 17, wherein the metal structure is a cavity.

25. A converter according to claim 24, wherein the cavity has opposing metal sidewalls and the beam passes through the cavity near the metal sidewalls.

26. A converter according to claim 25, wherein the information in the electric signal is encoded into the charged particle beam by bunching charged particles in the beam as the beam passes through the cavity.

* * * * *